United States Patent [19]
Yabu et al.

[11] Patent Number: 6,143,626
[45] Date of Patent: *Nov. 7, 2000

[54] METHOD OF MANUFACTURING A SEMICONDUCTOR DEVICE USING A TRENCH ISOLATION TECHNIQUE

[75] Inventors: Toshiki Yabu; Takashi Uehara; Mizuki Segawa; Takashi Nakabayashi, all of Osaka, Japan

[73] Assignee: Matsushita Electric Industrial Co., Ltd., Osaka, Japan

[*] Notice: This patent is subject to a terminal disclaimer.

[21] Appl. No.: 09/330,068

[22] Filed: Jun. 11, 1999

Related U.S. Application Data

[62] Division of application No. 08/574,690, Dec. 19, 1995, Pat. No. 5,960,300.

[30] Foreign Application Priority Data

Dec. 20, 1994 [JP] Japan .................................. 6-316593

[51] Int. Cl.$^7$ ...................................... H01L 21/76
[52] U.S. Cl. ...................... 438/436; 438/428; 438/435; 438/438; 438/692; 438/784
[58] Field of Search .................... 438/424, 435, 438/433, 436, 428, 692, 784, 434, 437, 429; 148/DIG. 50, DIG. 25, DIG. 70, DIG. 85; 257/374, 370, 397, 398, 514, 516, 513

[56] References Cited

U.S. PATENT DOCUMENTS

| | | |
|---|---|---|
| 4,506,435 | 3/1985 | Pliskin et al. . |
| 4,528,047 | 7/1985 | Beyer et al. ............................. 438/429 |
| 4,571,819 | 2/1986 | Rogers et al. .......................... 438/436 |
| 4,740,480 | 4/1988 | Ooka ....................................... 438/428 |
| 4,952,524 | 8/1990 | Lee et al. ................................. 438/437 |
| 5,306,940 | 4/1994 | Yamazaki ................................ 257/374 |
| 5,433,794 | 7/1995 | Fazan et al. ........................... 148/33.3 |
| 5,960,300 | 9/1999 | Yabu et al. .............................. 438/436 |

OTHER PUBLICATIONS

Silicon Processing for the VLSI Era vol. 2, by S. Wolf, pp; 104–105.

*Primary Examiner*—Matthew Smith
*Assistant Examiner*—Igwe U. Anya
*Attorney, Agent, or Firm*—McDermott, Will & Emery

[57] ABSTRACT

On a semiconductor substrate are successively deposited a silicon dioxide film and a silicon nitride film. The silicon nitride film, the silicon dioxide film, and the semiconductor substrate are sequentially etched using a photoresist film with an opening corresponding to an isolation region, thereby forming a trench. After depositing a diffusion preventing film, there is deposited an insulating film for isolation having reflowability. Although a void is formed in the insulating film for isolation in the isolation region, the insulating film for isolation is caused to reflow, thereby eliminating the void. After that, the whole substrate is planarized by CMP so as to remove the silicon nitride film and the silicon dioxide film, followed by the formation of gate insulating films, gate electrodes, sidewalls, and source/drain regions in respective element formation regions. Thus, in a highly integrated semiconductor device having a trench isolation, degradation of reliability resulting from the opening of the void in the surface of isolation is prevented.

9 Claims, 14 Drawing Sheets

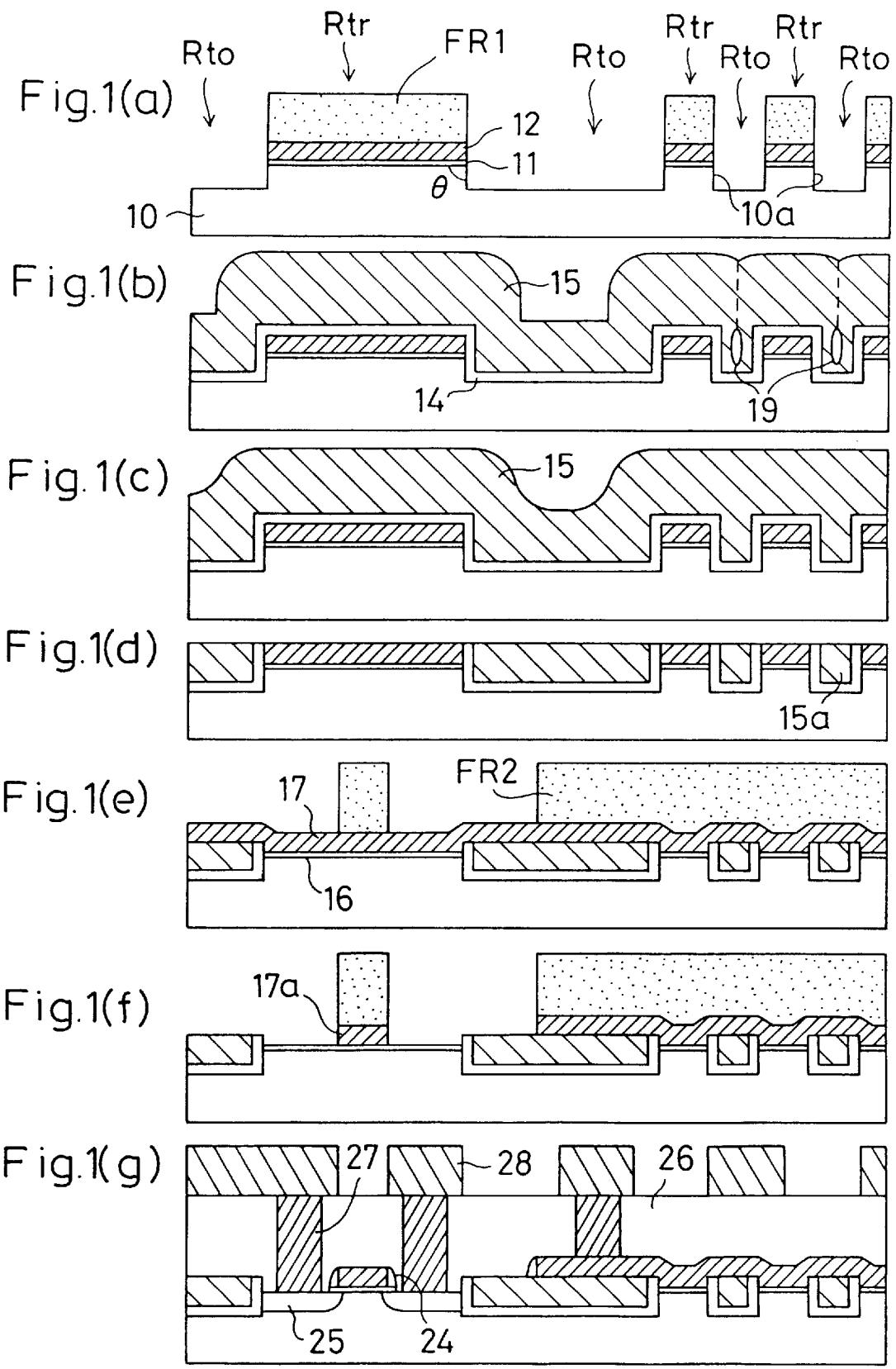

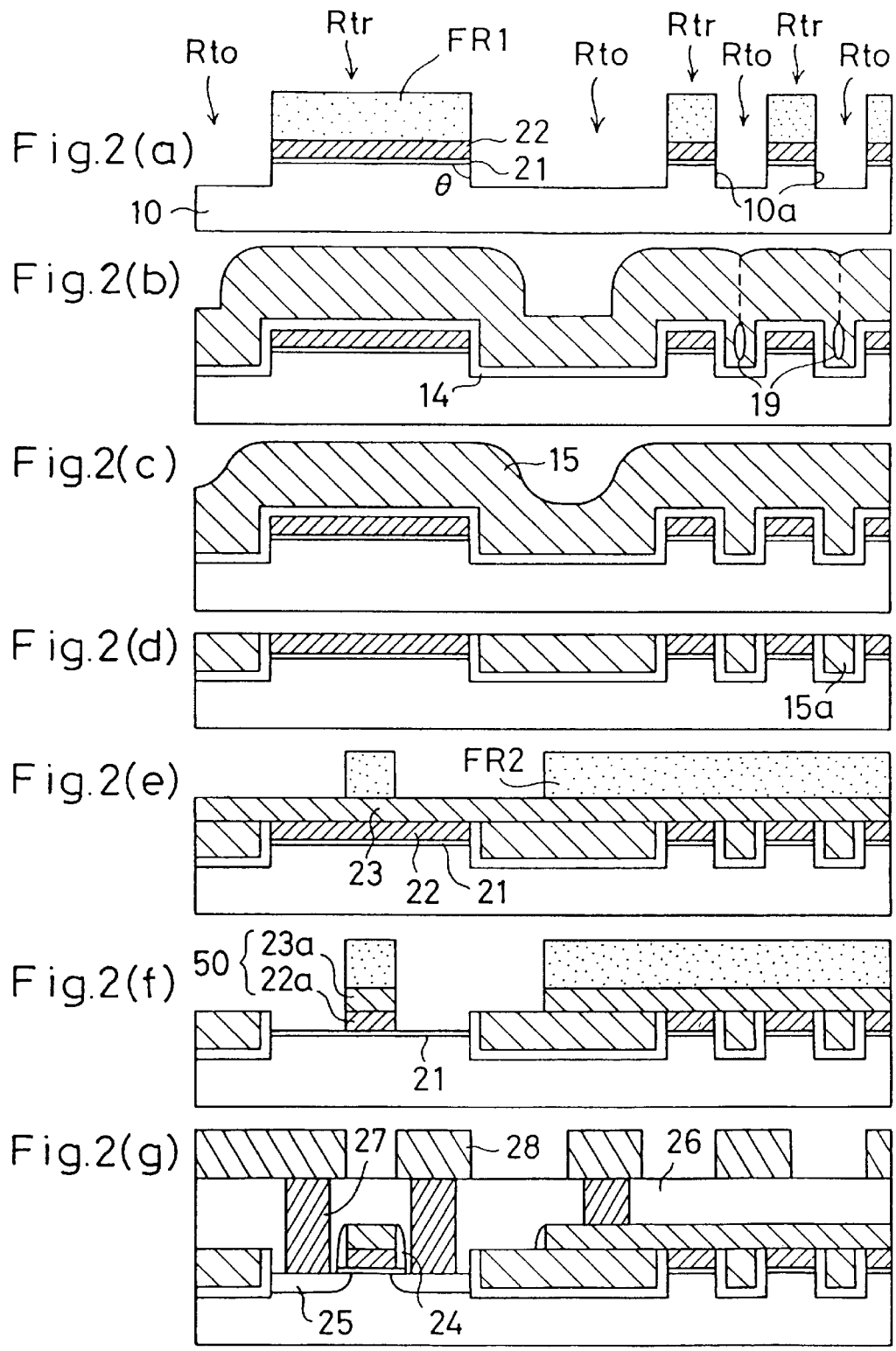

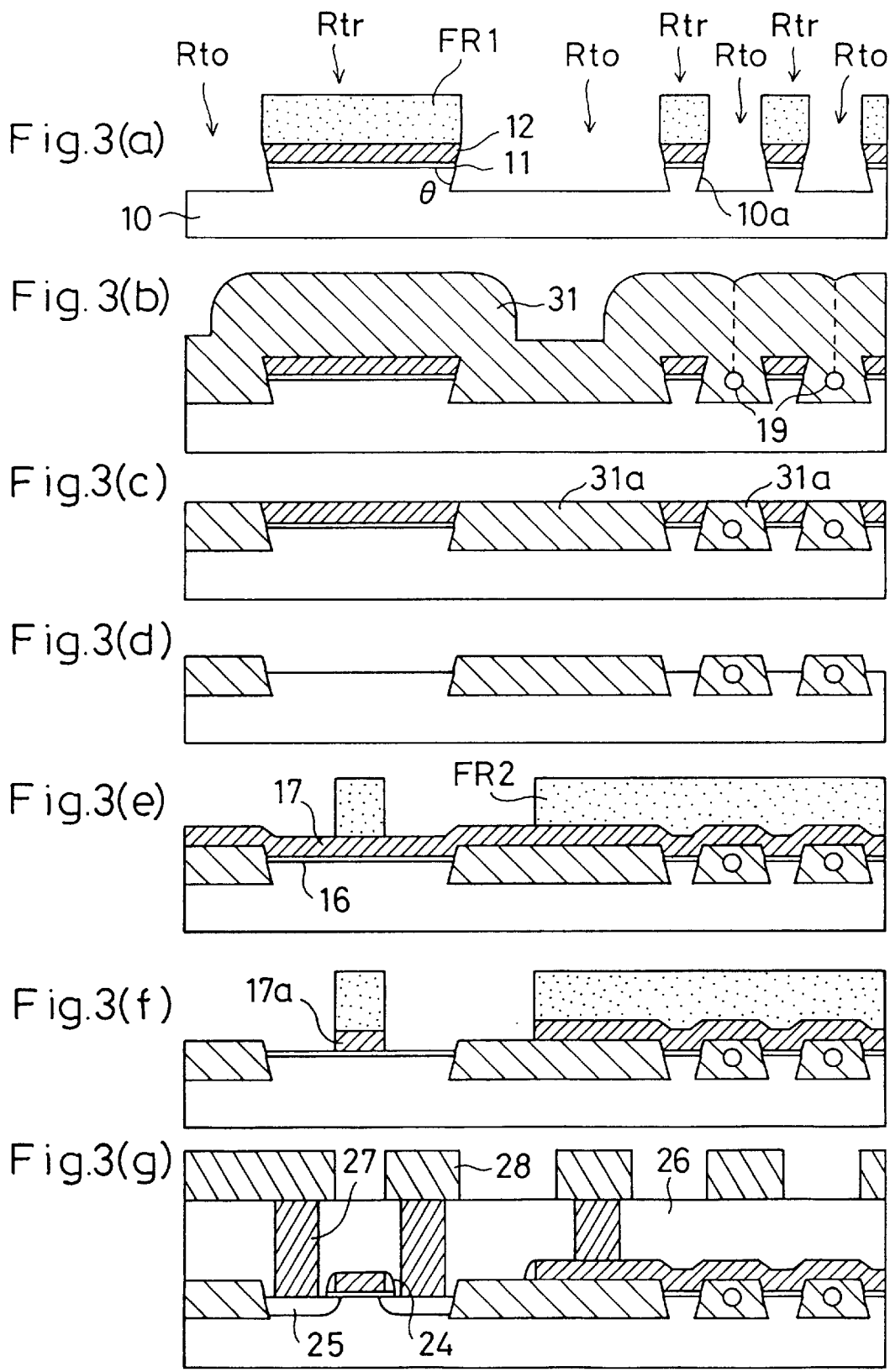

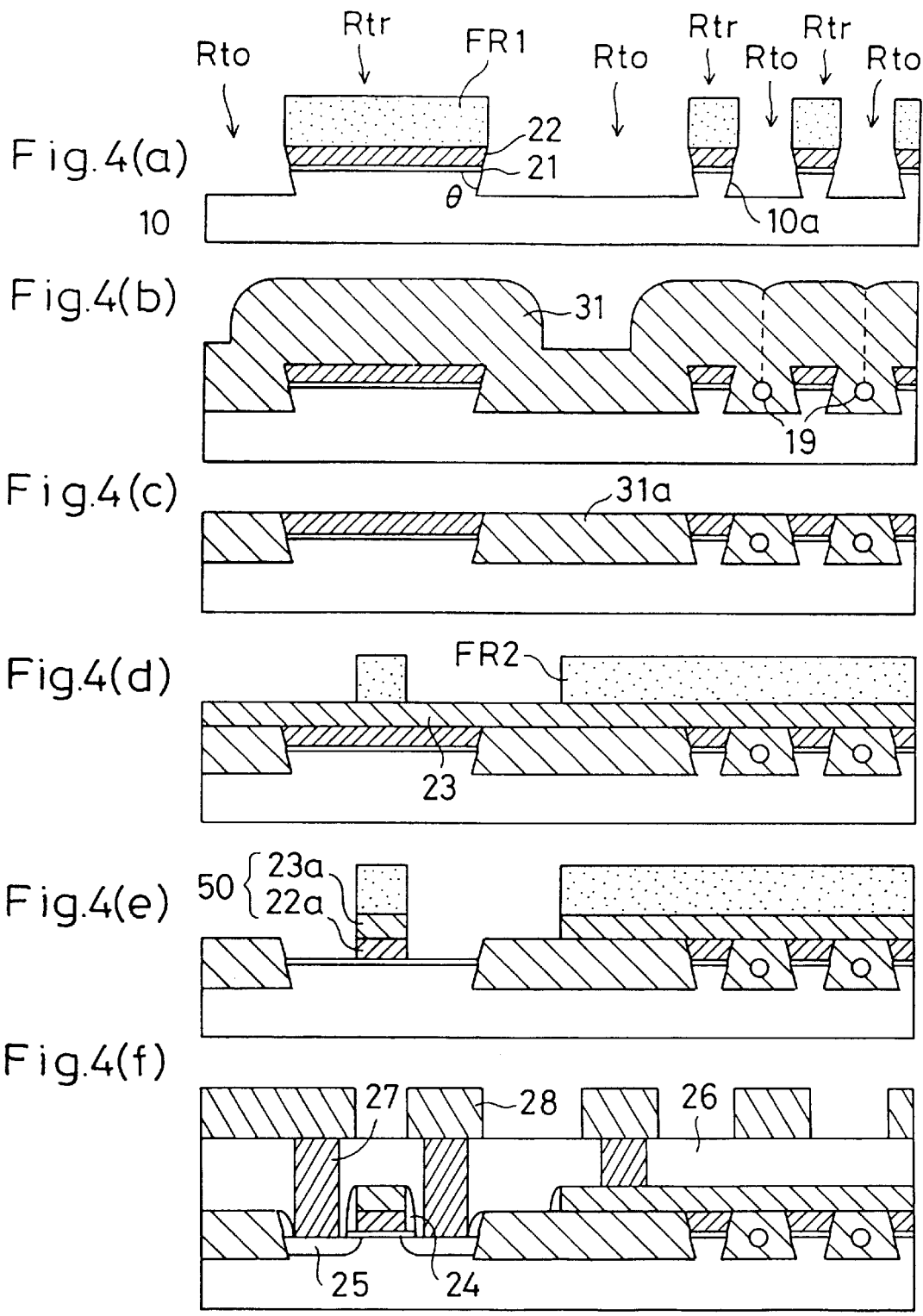

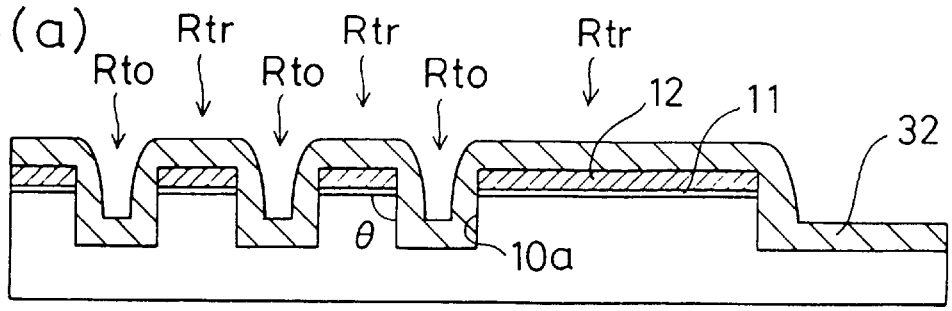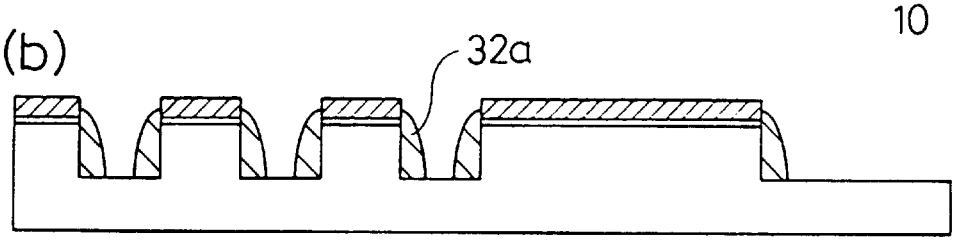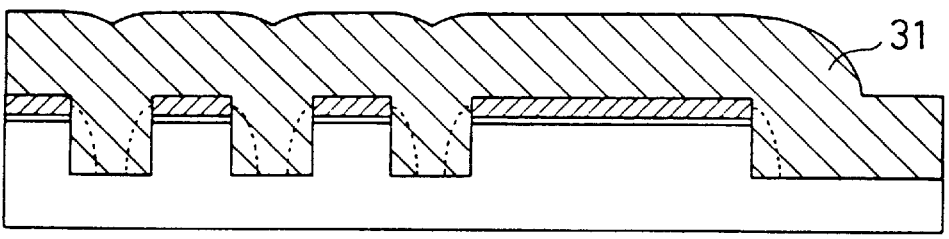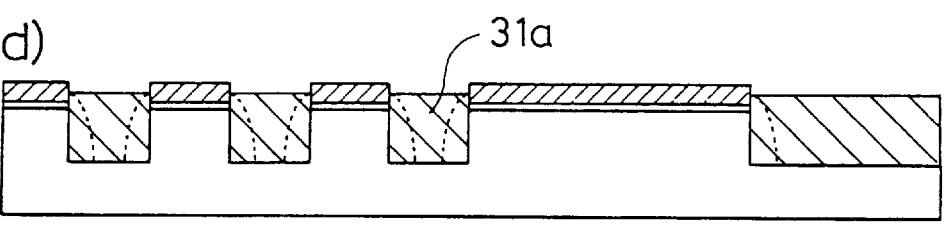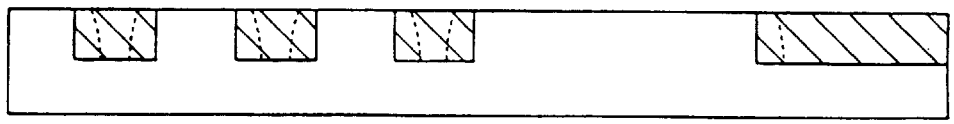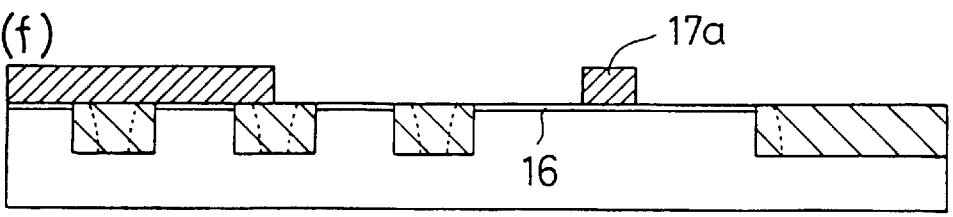

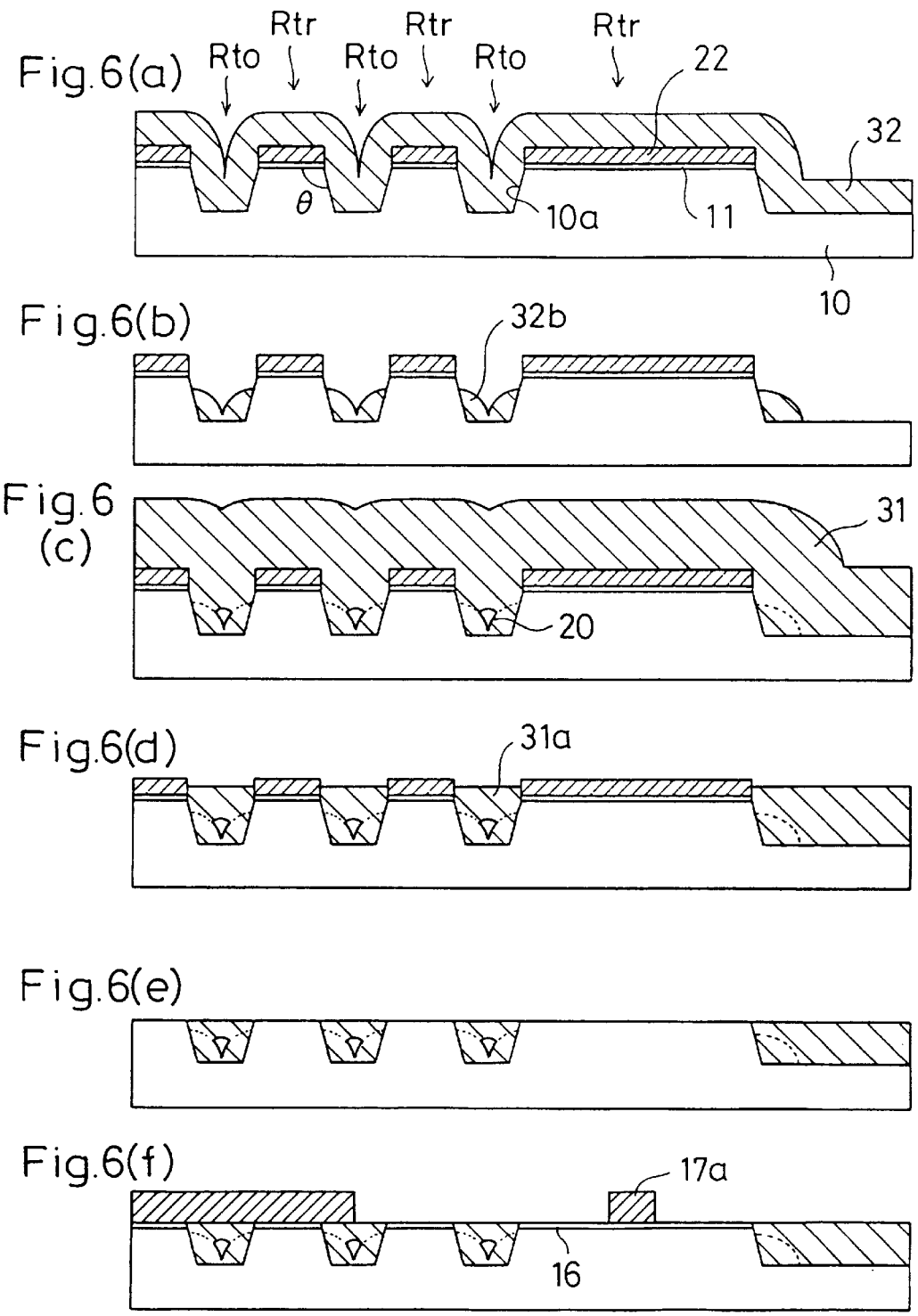

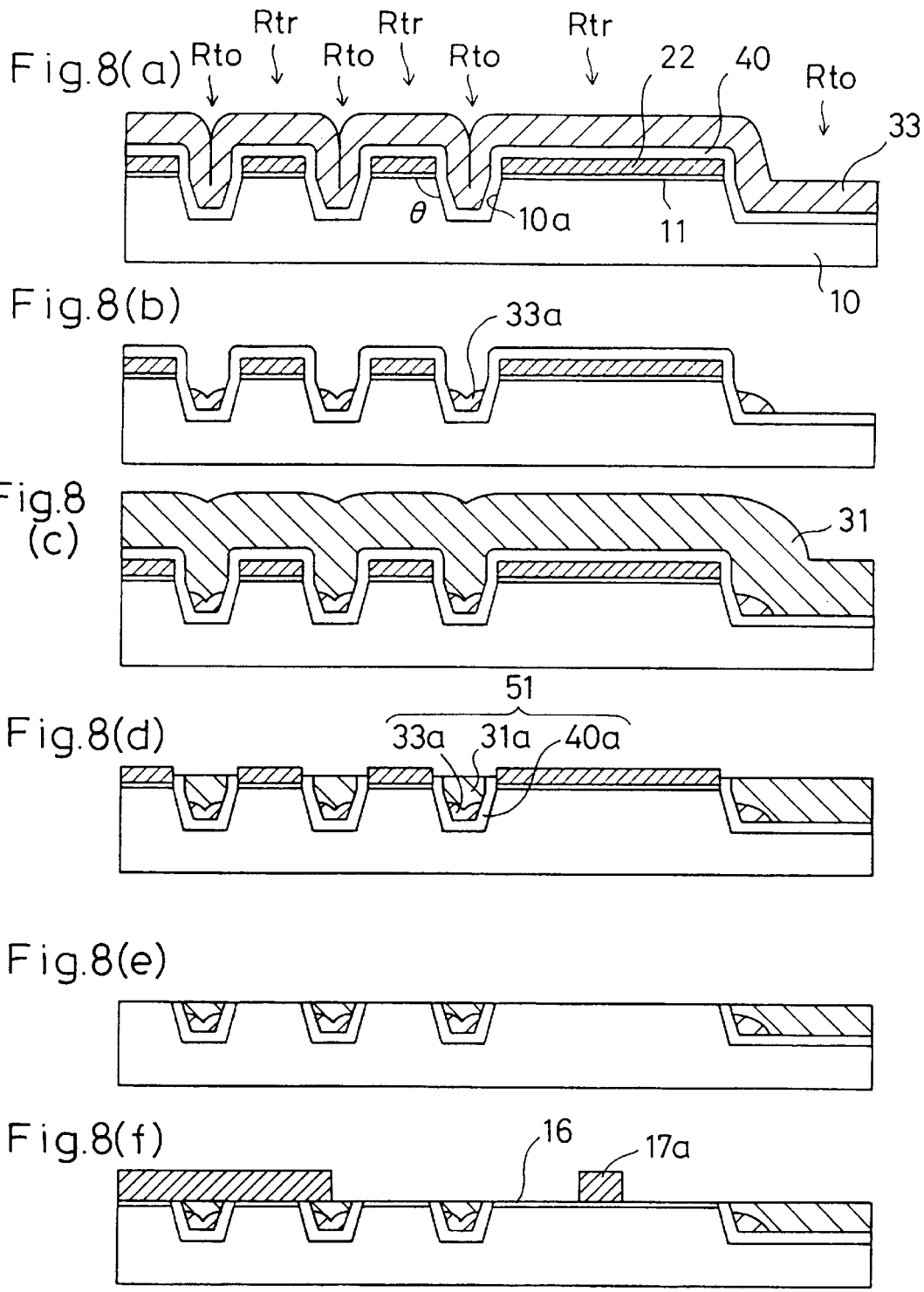

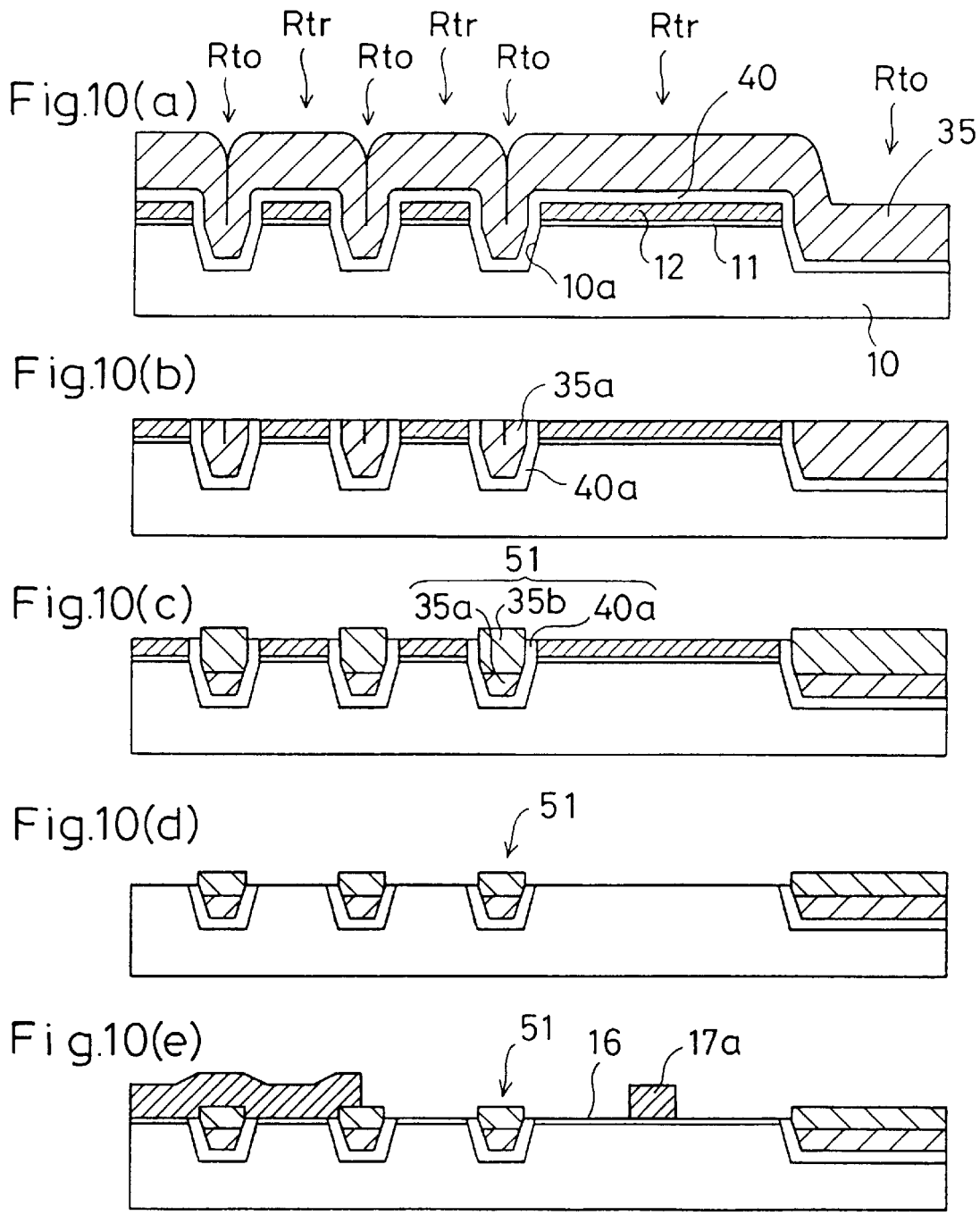

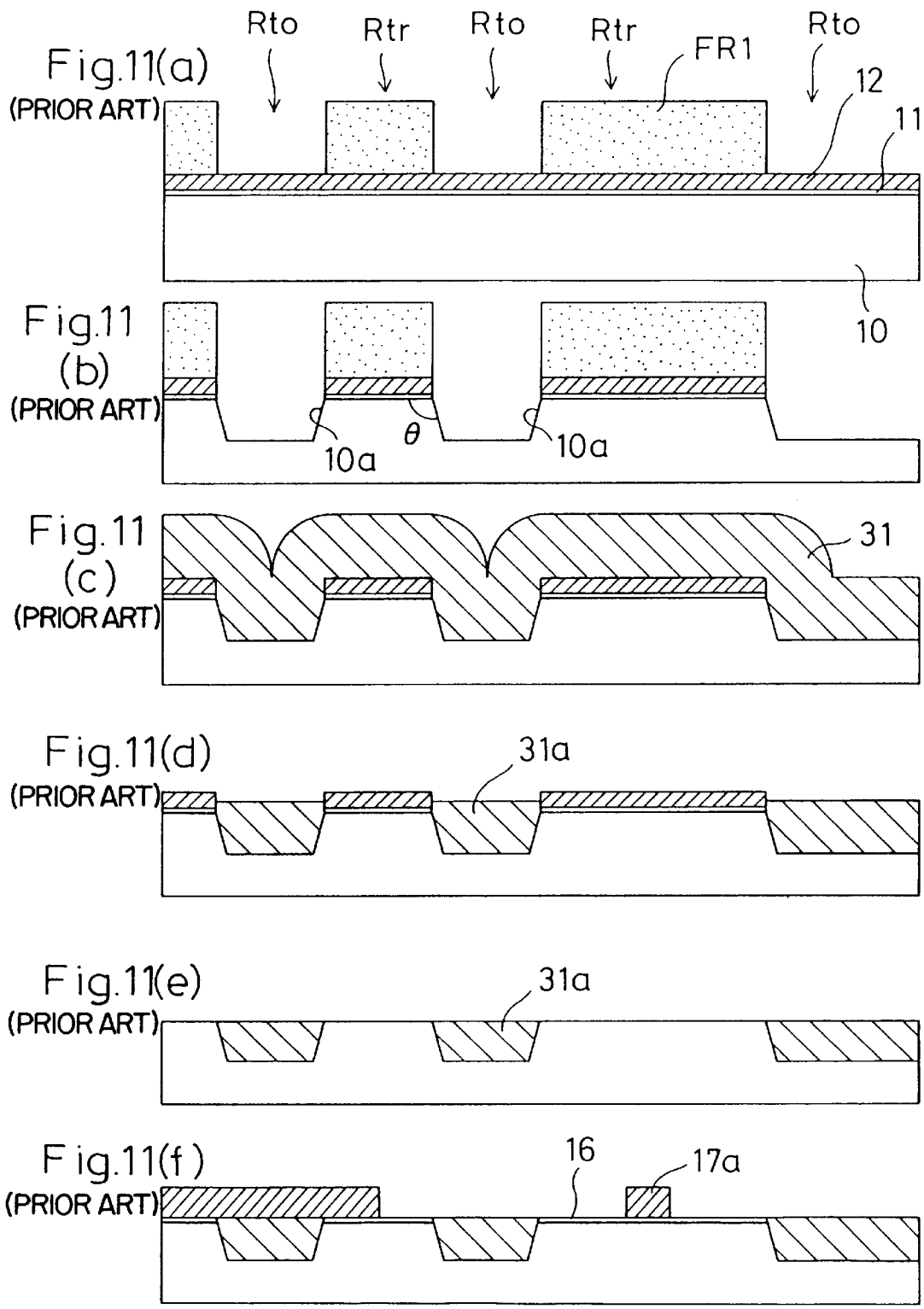

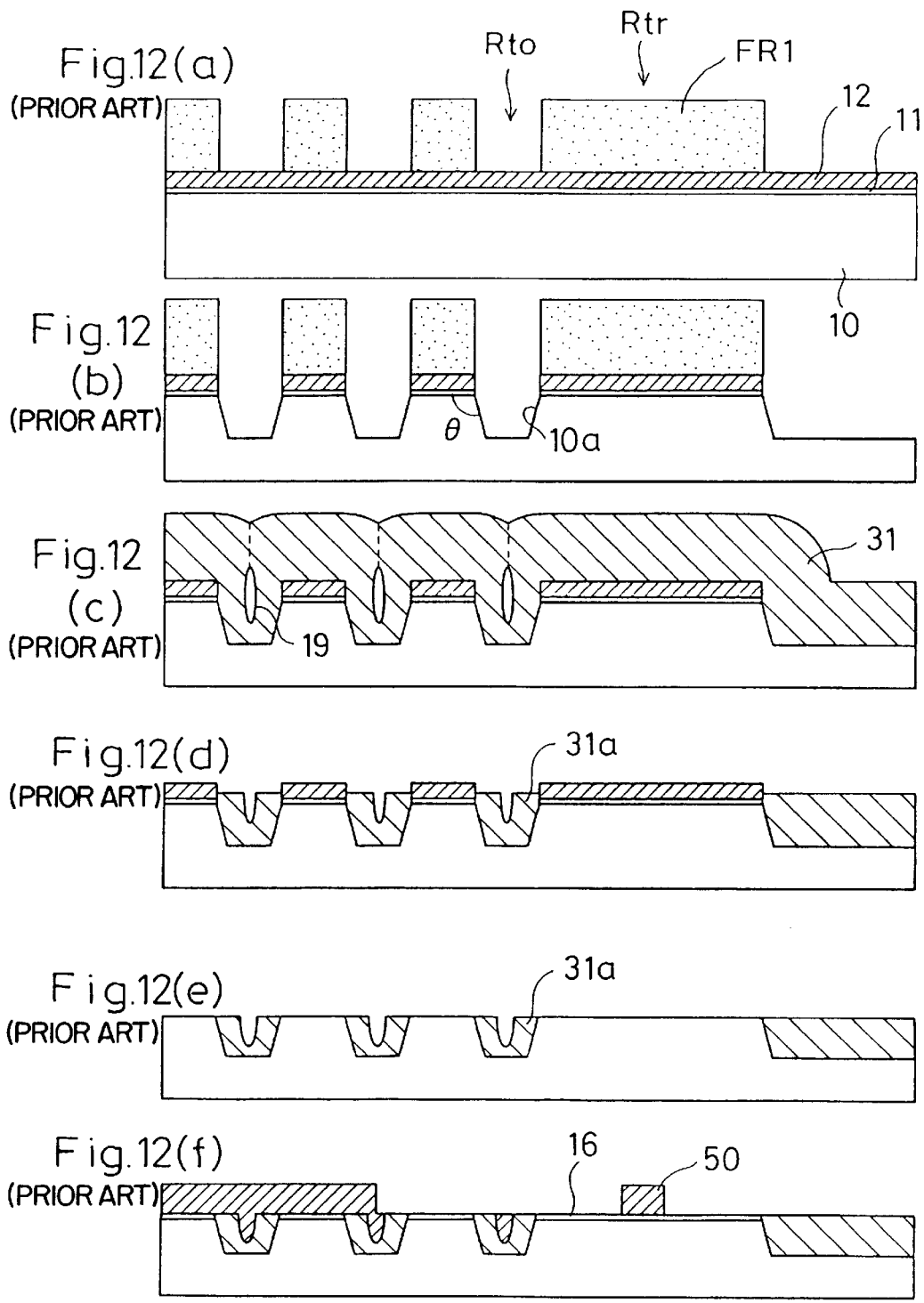

“METHOD OF MANUFACTURING A SEMICONDUCTOR DEVICE USING A TRENCH ISOLATION TECHNIQUE”

This application is a divisional application under 37 C.F.R. §1.53(b) of prior application Ser. No. 08/574,690 filed Dec. 19, 1995, now U.S. Pat. No. 5,960,300, issued Sep. 28, 1999.

BACKGROUND OF THE INVENTION

The present invention relates to a method of manufacturing a semiconductor device wherein an active region with MOS transistors mounted thereon is partitioned with a trench isolation.

With the recent tendency toward higher integration and increasing miniaturization of an LSI with semiconductor elements mounted thereon, there has been undertaken the study of trench isolation as a method of electrically isolating the individual semiconductor elements. The trench isolation is promising as a replacement for the LOCOS process which is predominantly used at present. According to the trench isolation, a trench is formed to surround regions in which the respective semiconductor elements are to be formed (element formation regions) and an insulating film is filled in the trench, thereby forming isolation. The following is the reason that the trench isolation has been studied as the replacement for the LOCOS process.

Since the LOCOS process involves selective oxidation of a silicon substrate, the bird's beak phenomenon occurs at the ends of a mask covering the element formation regions for preventing the oxidization thereof. The resulting insulating film intrudes into the element formation regions, which causes variations in size. The LOCOS process is also disadvantageous in that, as a further reduction is achieved in the spacing between the semiconductor elements, the rate at which oxygen is supplied is controlled. As a result, the insulating film becomes thinner in the element formation region with a smaller width than in the element formation region with a larger width, which degrades the isolating function.

On the other hand, the trench isolation is structurally free from the problem of the bird's beak and does not involve the selective oxidization process, so that the thinning of the insulating film due to the controlled oxygen supply rate does not occur. For this reason, the trench isolation is becoming prevalent in LSI fabrication with 0.5-μm design rules or under.

Below, a description will be given to a method of manufacturing a semiconductor device using conventional trench isolation. FIGS. 11(a) to 11(f) are cross sectional views illustrating procedures for forming trench isolation in a semiconductor device of relatively low integration.

Initially, as shown in FIG. 11(a), a silicon dioxide film 11 and a silicon nitride film 12 are deposited on a semiconductor substrate 10. After that, an opening corresponding to an isolation region Rto is formed in the silicon nitride film 12 and a photoresist film FR1 is formed to cover element formation regions Rtr.

Next, as shown in FIG. 11(b), etching is performed using the above photoresist film FR1 as a mask so as to selectively remove the silicon nitride film 11, the silicon dioxide film 11, and the semiconductor substrate 10, thereby forming a trench 10a. In this process, etching conditions are determined so that the angle θ between the surface of the semiconductor substrate 10 and the side face of the trench 10a, which is defined as a taper angle, has a value larger than 90°, i.e., so that the trench 10a is inwardly tapered at a large taper angle θ. Next, as shown in FIG. 11(c), the photoresist film FR1 is removed and then a silicon dioxide film with a thickness larger than the depth of the trench 10a is deposited by vacuum CVD so as to compose an insulating film 31 for isolation, with which the trench 10a is filled.

Next, as shown in FIG. 11(d), the substrate surface is planarized using, e.g., chemical mechanical polishing (hereinafter referred to as CMP). As a result, the insulating film 31 for isolation is completely removed from the element formation regions Rtr, thereby exposing the surface of the silicon nitride film 12. At this stage, the insulating film for isolation remaining in the trench 10a forms isolation 31a. Alternatively, there has also been used a method of forming the inverted pattern of the element formation regions Rtr from the photoresist film and performing etch back using the inverted pattern.

Next, as shown in FIG. 11(e), the silicon nitride film 12 is removed using, e.g., hot phosphoric acid and the silicon dioxide film 11 is subsequently removed using, e.g., a wet etching agent containing hydrofluoric acid as the main component, thereby completing the process of forming the isolation.

Next, as shown in FIG. 11(f), a polysilicon film is deposited on the substrate by a well-known method via a gate insulating film 16 composed of a silicon dioxide film. The polysilicon film is then patterned into gate electrodes 17a. Thereafter, such process steps as forming source/drain regions by ion implantation of an impurity, depositing an interlayer insulating film, forming contact holes in the interlayer insulating film, and forming upper metal interconnections are sequentially performed, though the drawing thereof is omitted, thereby finishing the semiconductor device.

In the above conventional method of manufacturing a semiconductor device, the taper angle θ between the side face of the trench 10a and the surface of the semiconductor substrate 10 is set at a value much larger than 90°, thereby implementing the inwardly tapered trench 10a with considerably steep side faces. This is for preventing a so-called shadowing effect in consideration of unsatisfactory step coverage of the silicon dioxide film composing the insulating film for isolation.

However, with higher integration of a semiconductor device, not only the element formation regions Rtr but also the isolation region Rto is reduced in size, which causes the following problems.

FIGS. 12(a) to 12(f) are cross sectional views illustrating the manufacturing process in the case of reducing the spacing between the semiconductor elements, i.e., the width of the isolation region Rto. The respective steps shown in FIGS. 12(a) to 12(f) are identical with those shown in FIGS. 11(a) to 11(f). Among these, FIG. 12(a) shows the step of forming the inwardly tapered trench 10a with its width gradually decreasing toward the bottom thereof. In this case, since the width of the isolation region Rto has been reduced, the taper angle θ inevitably approaches 90°. In other words, the taper angle θ is inevitably reduced rather than increased. Otherwise, the width of the bottom portion of the isolation 10a, which has been reduced together with the width of the isolation region Rto, may become excessively small because of the increased taper angle θ. In serious cases, the side faces interfere with each other at the bottom to present a triangular profile, which reduces the depth of the trench 10a and therefore inhibits the isolating function.

As a result of thus increasing an aspect ratio by reducing the width of the trench 10a and reducing the taper angle θ of the trench 10*a*, the probability of a void 19 being formed in the silicon dioxide film 31 becomes extremely high, as shown in FIG. 12(*c*), due to the shadowing effect. If the void 19 is opened in the planarized surface of the substrate, as shown in FIG. 12(*d*), the polysilicon composing the gate electrodes is filled in the void 19 in the subsequent step shown in FIG. 12(*f*). Since the vertical position in which the void is formed varies, the void 19 may not be opened in the step shown in FIG. 12(*d*), but it has a high possibility of being opened during the subsequent step. Referring now to FIG. 13(*a*), a description will be given to the relationship between the vertical position and formation possibility of the void. Although a void 19*x* shown in FIG. 13(*a*) is in a comparatively low position, it is opened at the time when the silicon nitride film 12 and silicon dioxide film 11 are removed in the step shown in FIG. 12(*e*), since the silicon dioxide film composing the isolation 31*a* is also removed to a certain extent (e.g., about 10 to 30 nm). In short, if the upper edge of the void 19*x* is higher in position than the surface of the isolation 31*a* which is defined in the subsequent step, as shown in FIG. 13(*b*), it is inevitably opened.

Although a large number of voids 19 apparently exist in the cross sectional views, they are actually connecting to each other, as can be seen from the plan view of FIG. 14. Accordingly, if a polysilicon film is deposited over the void to form the gate electrodes, the polysilicon film remains in the void, as shown in FIG. 12(*f*), so that the gate electrodes are shortcircuited via the polysilicon film remaining in the void. Even if it is supposed that the void is not opened in every cross section, reliability is degraded.

SUMMARY OF THE INVENTION

The present invention has been achieved in view of the foregoing. It is therefore an object of the present invention to provide a method of manufacturing a highly integrated semiconductor device with improved reliability which is free from a short circuit or degradation of the isolating function. According to the present invention, a void is prevented from being formed. However, in case a void has been formed, it is eliminated or otherwise formed deep inside an isolation such that the upper edge of the void is positioned below the surface of the isolation.

A first method of manufacturing a semiconductor device is for eliminating the void formed in an insulating film composing the isolation. Specifically, the first method comprises: a first step of depositing an etching stopper film on a semiconductor substrate having a plurality of element formation regions in which respective MOS transistors are to be formed and a trench isolation region for separating the above individual element formation regions; a second step of performing etching using a mask with an opening corresponding to the above isolation region so as to partially remove the above etching stopper film and the above semiconductor substrate from the above isolation region and thereby form a trench having a specified depth in the above semiconductor substrate; a third step of depositing, on the substrate formed with the above trench, an insulating film for isolation which is made of a reflowable material and which has a thickness larger than the depth of the above trench; a fourth step of causing the above insulating film to reflow by a thermal treatment; a fifth step of substantially planarizing a surface of the substrate by removing the above insulating film for isolation till at least a surface of the above etching stopper film becomes exposed, while leaving the above insulating film for isolation in the above trench, so as to form isolation; and a sixth step of forming MOS transistors each having a gate insulating film, a gate electrode, and source/drain regions in the above respective element formation regions, wherein either one of the above fourth step and the above fifth step is performed after the above third step and the other step is performed after the above one step and prior to the above sixth step.

By the above method, even when the void is formed in the insulating film for isolation deposited in the trench in the third step, the insulating film for isolation is softened and allowed to flow in the fourth step, thus eliminating the void. Consequently, degradation of reliability resulting from the opening of the void in the isolation can be prevented.

After the above fifth step and prior to the above sixth step, there can be provided the step of removing the above etching stopper film. In the above sixth step, it is also possible to newly deposit a conductive film for gate on the substrate and to pattern the above conductive film for gate into the gate electrodes of the above MOS transistors.

By the above method, the type and concentration of the impurity contained in the gate electrodes are not in the least affected by the impurity contained in the insulating film for isolation having reflowability. Consequently, the degree of freedom with which the characteristics of the MOS transistors are controlled is increased.

In the above first step, it is possible to deposit a first conductive film as the etching stopper film via the gate insulating film. In the above sixth step, it is possible to deposit a second conductive film on the substrate and to pattern the above first and second conductive films into the gate electrodes of the above MOS transistors.

By the above method, the step of removing the etching stopper film becomes unnecessary, resulting in simplified process. Moreover, since the surface of the semiconductor substrate is not exposed prior to depositing the insulating film for isolation, the impurity contained in the insulating film for isolation can be prevented more positively from intruding into the semiconductor substrate.

In the above third step, a silicon dioxide film containing at least any one of phosphorous, boron, and arsenic is preferably deposited as the insulating film for isolation.

By the above method, the temperature at which the silicon dioxide film is softened and allowed to flow is lowered, so that an adverse effect on the characteristics of the semiconductor device can be reduced.

After the above second step and prior to the above third step, it is preferable to further provide the step of forming a diffusion preventing film on the substrate, the above diffusion preventing film having a thickness smaller than the depth of the above trench and smaller than ½ of a minimum width of the above trench.

By the above method, the impurity contained in the insulating film for isolation having reflowability is prevented more positively from intruding into the semiconductor substrate and into the gate electrodes.

The above third step is preferably performed such that an angle between a side face of the above trench and the surface of the above substrate becomes 80° to 100°.

By the above method, even when the degree of integration of the semiconductor device is increased, the effects described above can be achieved, while providing the isolation with a sufficiently large width.

A second method of manufacturing a semiconductor device is for forming the void in the insulating film composing the isolation such that the upper edge of the void is positioned lower than the surface of the isolation. Specifically, the second method comprises: a first step of depositing an etching stopper film on a semiconductor substrate having a plurality of element formation regions in which respective MOS transistors are to be formed and a trench isolation region for separating the above individual element formation regions; a second step of performing etching using a mask with an opening corresponding to the above isolation region so as to partially remove the above etching stopper film and the above semiconductor substrate from the above isolation region and thereby form a trench in the above semiconductor substrate, a side face of the above trench forming an angle of 90° or less with respect to a surface of the above semiconductor substrate; a third step of depositing, on the substrate formed with the above trench, an insulating film for isolation to a thickness larger than a depth of the above trench; a fourth step of substantially planarizing the surface of the substrate by removing the above insulating film for isolation till at least a surface of the above etching stopper film becomes exposed, while leaving the above insulating film for isolation in the above trench, so as to form isolation; and a fifth step of forming MOS transistors each having at least a gate insulating film, a gate electrode, and source/drain regions in the above respective element formation regions.

By the above method, even when the void is formed in the insulating film for isolation, it is positioned only deep inside the trench, so that no void is opened in the surface of the isolation during the subsequent step. Consequently, degradation of reliability of the semiconductor device resulting from the opening of the void in the isolation can be prevented.

The above fourth step can be performed by chemical mechanical polishing and the above method can further comprise the step of, after the above fourth step and prior to the above fifth step, removing the above etching stopper film. In the above fifth step, a conductive film for gate can newly be deposited on the substrate and the above conductive film for gate is patterned into the gate electrodes of the above MOS transistors.

By the above method, removal of the isolation is not continued till the surface thereof is positioned lower than the etching stopper film, so that the opening of the void can be prevented more positively since the isolation undergoes only a negligible film reduction.

In the above first step, a first conductive film can be deposited as the etching stopper film via the gate insulating film. In the above fifth step, a second conductive film can be deposited on the substrate and the above first and second conductive films are patterned into the gate electrodes of the above MOS transistor.

By the above method, since the step of removing the first conductive film functioning as the etching stopper film becomes unnecessary, the top surface of the isolation and the first conductive film are held in substantially the same vertical position. Consequently, the top surface of the isolation is raised in level with a step formed between the surface of the semiconductor substrate and itself. Accordingly, the opening of the void in the surface of the isolation can be prevented more positively.

Third to fifth methods of manufacturing semiconductor devices according to the present invention is for preventing the void from being formed in the insulating film for isolation or limiting the formation of the void to a position deep inside the insulating film for isolation by partially filling the trench in the isolation region with another film. Specifically, they have the following structures.

The third method of manufacturing the semiconductor device according to the present invention comprises: a first step of depositing an etching stopper film on a semiconductor substrate having a plurality of element formation regions in which respective MOS transistors are to be formed and a trench isolation region for separating the above individual element formation regions; a second step of performing etching using a mask with an opening corresponding to the above isolation region so as to partially remove the above etching stopper film and the above semiconductor substrate from the above isolation region and thereby form a trench having a specified depth in the above semiconductor substrate; a third step of depositing, on the substrate formed with the above trench, a film for sidewalls; a fourth step of etching back the above film for sidewalls so as to form sidewalls on respective side faces of the above trench; a fifth step of depositing, with the above sidewalls formed, an insulating film for isolation on the substrate; a sixth step of substantially planarizing a surface of the substrate by removing the above insulating film for isolation till at least a surface of the above etching stopper film becomes exposed, while leaving the above insulating film for isolation in the above trench, so as to form isolation; and a seventh step of forming MOS transistors each having a gate insulating film, a gate electrode, and source/drain regions in the above respective element formation regions.

By the above method, when the sidewalls are formed in the trench in the isolation region in the fourth step, the trench is so configured as to be inwardly tapered at a large taper angle $\theta$. Since the insulating film for isolation is deposited over the inwardly tapered trench in the fifth step, no void is formed in the insulating film for isolation. Consequently, degradation of reliability resulting from the opening of the void in the isolation can be prevented.

The fourth method of manufacturing the semiconductor device according to the present invention comprises: a first step of depositing an etching stopper film on a semiconductor substrate having a plurality of element formation regions in which respective MOS transistors are to be formed and a trench isolation region for separating the above individual element formation regions; a second step of performing etching using a mask with an opening corresponding to the above isolation region so as to partially remove the above etching stopper film and the above semiconductor substrate from the above isolation region and thereby form a trench having a specified depth in the above-semiconductor substrate; a third step of depositing, on the substrate formed with the above trench, an insulating film for filling; a fourth step of etching back the above insulating film for filling so as to form a buried layer in a position at least lower than an upper edge of the above trench; a fifth step of depositing, with the above buried layer formed in the above trench, an insulating film for isolation on the substrate; a sixth step of substantially planarizing a surface of the substrate by removing the above insulating film for isolation till at least a surface of the above etching stopper film becomes exposed, while leaving the above insulating film for isolation in the above trench, so as to form an isolation; and a seventh step of forming MOS transistors each having a gate insulating film, a gate electrode, and source/drain regions in the above respective element formation regions.

By the above method, the buried layer has been formed in a position lower than the upper edge of the trench in the isolation region in the step preceding to the fifth step of depositing the insulating film for isolation. Consequently, no void is formed by the deposition of the insulating film for isolation or, even when the void has been formed, it is located deep inside the trench. As a result, no void is opened in the surface of the isolation, thereby preventing degradation of reliability resulting from the opening of the void in the isolation.

In the above third step, the insulating film for filling can be deposited to such a thickness that, in the above fifth step, sidewalls are formed as the above buried layer on respective side faces of the above trench and a recessed portion having steeply sloped side faces is formed between lower parts of the sidewalls.

By the above method, if the insulating film for isolation is deposited in the fifth step, the probability of the void being formed between the insulating film for isolation and the recessed portion of the insulating film for filling is increased. However, even when the void has been formed, it is located deep inside the trench, so that no void is opened in the surface of the isolation. Consequently, degradation of reliability resulting from the opening of the void in the isolation can be prevented.

In the above third step, the etching stopper film having a thickness equal to or more than ½ of a minimum width of the above isolation region can be deposited such that a void is formed in the above insulating film for filling in a portion having a minimum width of the above isolation region. In the above fourth step, after the above void is opened, the above insulating film for filling can be etched back till at least a part of the insulating film for filling beneath a lower edge of the void is removed.

By the above method, when the insulating film for filling is deposited to a relatively large thickness in the third step, the void in the form of a vertically elongated slit (elliptical in cross section) is formed in the insulating film for filling in the isolation region. When the insulating film for isolation is subsequently etched back in the fourth step till at least a part of the lower edge of the void is removed, the recessed portion having steep sidewalls is formed in a position lower than that of the original void. Since the insulating film for isolation is deposited thereon, the same effect as described above can be obtained.

In the above third step, an insulating film for filling which is made of a reflowable material and which has a thickness equal to or more than ½ of a minimum width of the above isolation region can be deposited as the above insulating film for filling. The above method can further comprises the step of, after the above third step and prior to the above fifth step, causing the above film for filling to reflow by a thermal treatment.

By the above method, even when the void has been formed in the buried layer, it can surely be eliminated. Since the insulating film for isolation is deposited in the trench with an aspect ratio reduced by the buried layer, no void is formed in the insulating film for isolation.

The fifth method of manufacturing the semiconductor device according to the present invention comprises: a first step of depositing an etching stopper film on a semiconductor substrate having a plurality of element formation regions in which respective MOS transistors are to be formed and a trench isolation region for separating the above individual element formation regions; a second step of performing etching using a mask with an opening corresponding to the above isolation region so as to partially remove the above etching stopper film and the above semiconductor substrate from the above isolation region and thereby form a trench having a specified depth in the above semiconductor substrate; a third step of depositing, on the substrate formed with the above trench, an underlying insulating film; a fourth step of depositing, on the substrate with the above underlying insulating film deposited thereon, a film for filling made of a material with excellent step coverage; a fifth step of etching back the above film for filling so as to form a buried layer in a position at least lower than an upper edge of the above trench; a sixth step of depositing, on the substrate with the above buried layer formed therein, an insulating film for isolation; a seventh step of substantially planarizing a surface of the substrate by removing the above insulating film for isolation till at least a surface of the above etching stopper film becomes exposed, while leaving the above insulating film for isolation in the above trench, so as to form isolation; and an eighth step of forming MOS transistors each having a gate insulating film, a gate electrode, and source/drain regions in the above respective element formation regions.

By the above method, the buried layer composed of the film for filling with excellent coverage is formed in the fourth and fifth steps with no void formed therein. Moreover, since the insulating film for isolation is deposited over the trench having a reduced aspect ratio, no void is formed in the insulating film for isolation. Consequently, degradation of reliability resulting from the opening of the void in the insulation can be prevented.

A sixth method of manufacturing a semiconductor device comprises: a first step of depositing an etching stopper film on a semiconductor substrate having a plurality of element formation regions in which respective MOS transistors are to be formed and a trench isolation region for separating the above individual element formation regions; a second step of performing etching using a mask with an opening corresponding to the above isolation region so as to partially remove the above etching stopper film and the above semiconductor substrate from the above isolation region and thereby form a trench having a specified depth in the above semiconductor substrate; a third step of depositing, on the substrate formed with the above trench, an underlying insulating film; a fourth step of depositing, on the substrate with the above underlying insulating film deposited thereon, a semiconductor film; a fifth step of substantially planarizing a surface of the substrate by removing the above semiconductor film till at least a surface of the above etching stopper film becomes exposed, while leaving the above semiconductor film in the above trench; a six step of oxidizing at least a surface region of the above semiconductor film so as to form isolation; and a seventh step of forming MOS transistors each having a gate insulating film, a gate electrode, and source/drain regions in the above respective element formation regions.

By the above method, since the semiconductor film has excellent step coverage, no void is formed in the semiconductor film in the fourth step. Consequently, no void is opened in the surface of an oxide film formed by using the semiconductor film, i.e., in the surface of the isolation. Consequently, degradation of reliability resulting from the opening of the void in the isolation can be prevented.

BRIEF DESCRIPTION OF THE DRAWINGS

FIGS. 1(a) to 1(g) are cross sectional views illustrating a method of manufacturing a semiconductor device according to a first embodiment;

FIGS. 2(a) to 2(g) are cross sectional views illustrating a method of manufacturing a semiconductor device according to a second embodiment;

FIGS. 3(a) to 3(g) are cross sectional views illustrating a method of manufacturing a semiconductor device according to a third embodiment;

FIGS. 4(a) to 4(f) are cross sectional views illustrating a method of manufacturing a semiconductor device according to a fourth embodiment;

FIGS. 5(a) to 5(f) are cross sectional views illustrating a method of manufacturing a semiconductor device according to a fifth embodiment;

FIGS. 6(a) to 6(f) are cross sectional views illustrating a method of manufacturing a semiconductor device according to a sixth embodiment;

FIGS. 8(a) to 8(f) are cross sectional views illustrating a method of manufacturing a semiconductor device according to an eighth embodiment;

FIGS. 10(a) to 10(e) are cross sectional views illustrating a method of manufacturing a semiconductor device according to a tenth embodiment;

FIGS. 11(a) to 11(f) are cross sectional views illustrating a typical conventional method of manufacturing a semiconductor device;

FIGS. 12(a) to 12(f) are cross sectional views illustrating a conventional method of manufacturing a semiconductor device of high integration;

Figure 7A:
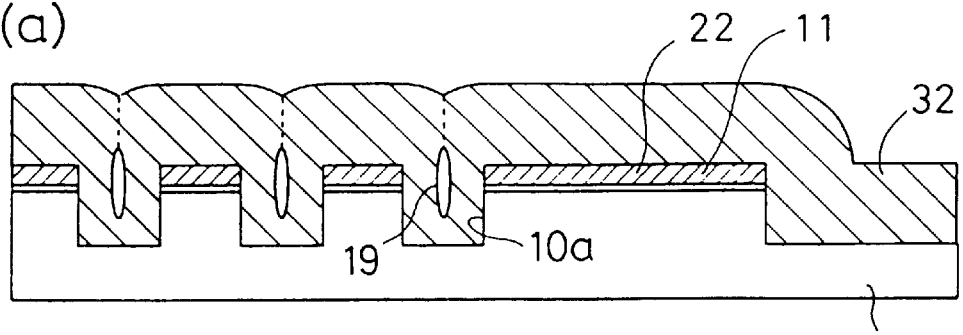
FIGS. 7(a) to 7(f) are cross sectional views illustrating a method of manufacturing a semiconductor device according to a seventh embodiment.

DETAILED DESCRIPTION OF THE INVENTION (First Embodiment)

Initially, as shown in FIG. 1(a), a silicon dioxide film 11 with a thickness of about 10 to 20 nm and a silicon nitride film 12 with a thickness of about 150 to 200 nm as an etching stopper film are deposited on a semiconductor substrate 10. After that, an opening corresponding to an isolation region Rto is formed in the silicon nitride film 12 and a photoresist film FR1 is formed to cover element formation regions Rtr. Subsequently, etching is performed using the above photoresist film FR1 as a mask so as to selectively remove the silicon nitride film 12, the silicon dioxide film 11, and the semiconductor substrate 10, thereby forming a trench 10a having a specified depth of about 500 nm. In this process, the etching conditions are determined so that the taper angle θ between the surface of the semiconductor substrate 10 and the side face of the trench 10a becomes approximately 90° (within the range of 80° to 100°).

Next, as shown in FIG. 1(b), the photoresist film FR1 is removed and then a silicon dioxide film (such as a thermal oxide film, a silane-based HTO film, or a TEOS-based HTO film) is deposited by vacuum CVD to a thickness smaller than the depth of the trench 10a, so as to compose a diffusion preventing film 14 with a thickness of about 20 nm. On the diffusion preventing film 14 is further deposited a silicon dioxide film to a thickness larger than the depth of the trench 10a so as to compose an insulating film 15 for isolation with a thickness of about 800 to 1000 nm, with which the trench 10a is filled. The insulating film 15 for isolation is composed of a reflowable film such as a silane-based BPSG film or a TEOS-based BPSG film. Instead of the BPSG films, such films as a PSG film, a BSG film, or an arsenic-containing silicon dioxide film can also be used. It is also possible to deposit a silicon dioxide film and then impart reflowability thereto by implanting impurity ions into the silicon dioxide film.

Since an aspect ratio of the trench 10a is high in the isolation region Rto with a reduced width as shown in FIG. 1(b), the probability of a void 19 being formed in the insulating film 15 for isolation is extremely high.

In the step shown in FIG. 1(c), the present embodiment performs a characteristic thermal treatment, e.g., at 850 °C. for 30 minutes so as to cause the insulating 15 film for isolation to reflow, thereby eliminating the void 19.

Next, as shown in FIG. 1(d), the substrate surface is planarized by, e.g., chemical mechanical polishing (hereinafter referred to as CMP). As a result, the insulating film 15 for isolation and diffusion preventing film 14 are completely removed from the element formation regions Rtr, thereby exposing the surface of the silicon nitride film 12. At this stage, the insulating film for isolation remaining in the trench 10a forms isolation 15a.

Next, as shown in FIG. 1(e), the silicon nitride film 12 is removed using, e.g., hot phosphoric acid and the silicon dioxide film 11 is subsequently removed using, e.g., a wet etching agent containing hydrofluoric acid as the main component, thereby completing the process of forming the isolation. Thereafter, a gate insulating film 16 and a polysilicon film 17 are deposited on the substrate. On the polysilicon film 17 is then formed a photoresist film FR2 which covers regions in which gate electrodes and the like are to be formed.

Next, as shown in FIG. 1(f), the polysilicon film 17 is etched using the photoresist film FR2 as a mask, thereby patterning gate electrodes 17a.

After that, as shown in FIG. 1(g), such process steps as forming sidewalls 24 on the side faces of the gate electrode 17a, forming source/drain regions 25, depositing an interlayer insulating film 26, forming contact holes in the interlayer insulating film, forming buried metals 27 in the contact holes, and forming upper metal interconnections 28 are sequentially performed, thereby finishing the semiconductor device.

As described above, even though the probability of the void 19 being formed in the insulating film 15 for isolation is increased by a reduced width of the isolation region Rto and an increased aspect ratio of the trench 10a, the present embodiment causes the insulation film 15 for isolation to reflow, thereby eliminating the void 19.

Although the above embodiment has formed the diffusion preventing film 14 immediately below the insulating film 15 for isolation, the provision of the diffusion preventing film 14 may be omitted depending on cases. However, the provision of the diffusion preventing film 14 surely prevents the impurity contained in the insulating film 15 for isolation from intruding into the semiconductor substrate 10 and hence improves the reliability of respective MOS transistors formed in the element formation regions Rtr.

Instead of the silicon nitride film 12 functioning as the etching stopper film, a polysilicon film may be deposited so that it is etched away after completing the planarizing step.

Alternatively, the step of causing the insulating film 15 for isolation to reflow may be performed after completing the planarizing step.

(Second Embodiment)

A manufacturing method of the present embodiment is different from that of the above first embodiment in that the etching stopper film used in forming the trench for isolation is composed of a polysilicon film as a first conductive film and a second conductive film is further deposited thereon, thereby composing the gate electrodes of the resulting multilayer film.

Initially, as shown in FIG. 2(a), a gate insulating film 21 with a thickness of about 10 nm and a polysilicon film 22

(first conductive film) with a thickness of about 150 to 300 nm as the etching stopper film are deposited on the semiconductor substrate 10. After that, an opening corresponding to the isolation region Rto is formed in the polysilicon film 22 and the photoresist film FR1 is formed to cover the element formation regions Rtr. Subsequently, etching is performed using the above photoresist film FR1 as a mask so as to selectively remove the polysilicon film 22, the gate insulating film 21, and the semiconductor substrate 10, thereby forming the trench 10a having a specified depth of about 500 nm. In this process, the etching conditions are determined so that the taper angle θ between the surface of the substrate 10 and the side face of the trench 10a becomes approximately 90° (within the range of 80° to 100°).

Next, the same process steps as shown in FIGS. 1(b) to 1(d) of the first embodiment are performed in the process steps shown in FIGS. 2(b) to 2(d). Briefly, the void formed in the insulating film 15 for isolation is eliminated by the reflowing process, followed by the planarizing process.

Next, as shown in FIG. 2(e), a polysilicon film 23 as a second conductive film is deposited on the planarized substrate to a thickness of about 100 to 200 nm, on which is formed the photoresist film FR2 which covers the regions in which the gate electrodes and the like are to be formed.

Next, as shown in FIG. 2(f), the two polysilicon films 22 and 23 are etched using the photoresist film FR2 as a mask, thereby patterning the gate electrodes 50 composed of a lower film 22a and an upper film 23a.

Thereafter, the same process step as shown in FIG. 1(g) of the above first embodiment is performed as shown in FIG. 2(g), thereby finishing the semiconductor device.

Even though the probability of the void 19 being formed in the insulating film 15 for isolation is increased by the reduced width of the isolation region Rto and the increased aspect ratio of the trench 10a, the present embodiment also causes the insulation film 15 for isolation to reflow, thereby eliminating the void 19. Compared with the above first embodiment, since the present embodiment has formed or deposited each of the gate insulating film 21 and the polysilicon film for gate 22 prior to the formation of the isolation 15a, the surface of the semiconductor substrate 10 is not exposed prior to the deposition of the insulating film 15 for isolation. Consequently, the present embodiment offers the advantage of no risk of variations in transistor characteristics due to the diffusion of the impurity contained in the insulating film 15 for isolation, such as boron or phosphorus. Moreover, since the underlay in patterning the gate electrode 50 is flat with no difference in level, a micropattern can stably be formed.

Although the upper film 23a of the gate electrode 50 is composed of the polysilicon film 23 in the above embodiment, it may be composed of a silicide film of WSi, TiSi, or the like. The upper film 23a may also be composed of a multilayer film consisting of a barrier metal such as TiN and a high-melting-point metal such as W for the purpose of reducing the electric resistance of the gate electrodes 50.

Although the above embodiment has formed the diffusion preventing film 14 immediately below the insulating film 15 for isolation, the provision of the diffusion preventing film 14 may be omitted depending on cases. However, the provision of the diffusion preventing film 14 surely prevents the impurity contained in the insulating film 15 for isolation from intruding into the semiconductor substrate 10 and hence improves the reliability of the respective MOS transistors formed in the element formation regions Rtr.

Alternatively, the step of causing the insulating film 15 for isolation to reflow may be performed after completing the planarizing step.

(Third Embodiment)

A manufacturing method of the present embodiment is different from those of the above first and second embodiments in that the trench for isolation has an outwardly tapered profile so as to form the void deep inside the insulating film for isolation.

Initially, as shown in FIG. 3(a), the silicon dioxide film 11 with a thickness of about 10 to 20 nm and the silicon nitride film 12 with a thickness of about 150 to 200 nm as the etching stopper film are deposited on the semiconductor substrate 10. After that, an opening corresponding to the isolation region Rto is formed in the silicon nitride film 12 and the photoresist film FR1 is formed to cover the element formation regions Rtr. Subsequently, etching is performed using the above photoresist film FR1 as a mask so as to selectively remove the silicon nitride film 12, the silicon dioxide film 11, and the semiconductor substrate 10, thereby forming the trench 10a having a specified depth of about 500 nm. In this process, the etching conditions are determined so that the taper angle θ between the surface of the substrate 10 and the side face of the trench 10a becomes 90° or less (within the range of 80° to 100°).

Next, as shown in FIG. 3(b), the photoresist film FR1 is removed and then a silicon dioxide film is deposited on the substrate to a thickness larger than the depth of the trench 10a so as to compose an insulating film 31 for isolation, with which the trench 10a is filled. Unlike the insulating films for isolation used in the above first and second embodiments, the insulating film 31 for isolation used in the present embodiment has no reflowability.

In the present embodiment, since the trench 10a is outwardly tapered with its width gradually increasing toward the bottom thereof as shown in FIG. 3(b), the shadowing effect is enhanced and the upper part of the trench 10a is filled with the insulating film 31 for isolation at an early stage of deposition. Consequently, the void 19 which is substantially circular in cross section is formed deep inside the trench 10a.

Next, as shown in FIG. 3(c), the substrate surface is substantially planarized using, e.g., CMP. As a result, the insulating film 31 for isolation is completely removed from the element formation regions Rtr, thereby exposing the surface of the silicon nitride film 12. At this stage, the insulating film for isolation remaining in the trench forms isolation 31a.

Next, as shown in FIG. 3(d), the silicon nitride film 12 is removed using, e.g., hot phosphoric acid and the silicon dioxide film 11 is subsequently removed using, e.g., a wet etching agent containing hydrofluoric acid as the main component, thereby completing the process of forming the isolation.

Next, as shown in FIG. 3(e), the gate insulating film 16 and the polysilicon film 17 are deposited on the substrate. On the polysilicon film 17 is formed the photoresist film FR2 which covers regions in which the gate electrodes and the like are to be formed.

Next, as shown in FIG. 3(f), the polysilicon film 17 is etched using the photoresist film FR2 as a mask, thereby patterning the gate electrodes 17a.

After that, the same process step as shown in FIG. 1(g) is performed as shown in FIG. 3(g), thereby finishing the semiconductor device.

Since the present embodiment has used the trench 10a for isolation having the outwardly tapered profile, the shadowing effect is enhanced in depositing the insulating film 31 for isolation in the trench 10a. The shadowing effect is a phenomenon in which only a reduced amount of silicon dioxide reaches the lower part of the trench 10a due to the silicon dioxide film deposited on the upper parts of the side faces of the trench 10a. Because the enhanced shadowing effect is exerted in depositing the silicon dioxide film on the side faces of the trench 10a in the step shown in FIG. 3(b), the void is filled in a position comparatively deep inside the trench 10a. Consequently, the upper edge of the void 19 is held in a position lower than the surface of the isolation 31a, which surely prevents the void 19 from being opened in the surface during the subsequent step.

In particular, since the present embodiment has deposited the silicon nitride film 12 to a relatively large thickness, the top surface of the isolation 31a becomes higher than the top surface of the semiconductor substrate 10 in the element formation regions Rtr in the subsequent step of removing the silicon nitride film 12, which is shown in FIG. 3(d), so that the effect of preventing the void 19 from being opened is enhanced.

Instead of the silicon nitride film 12 functioning as the etching stopper film, a polysilicon film may be deposited so that it is etched away after completing the planarizing step.

(Fourth Embodiment)

A manufacturing method of the present embodiment is different from that of the above third embodiment in that the etching stopper film used in forming the trench for isolation is composed of a polysilicon film as the first conductive film and the second conductive film is further deposited thereon, thereby composing the gate electrode of the resulting multilayer film.

Initially, as shown in FIG. 4(a), the gate insulating film 21 with a thickness of about 10 nm and the polysilicon film 22 with a thickness of about 150 to 300 nm as the etching stopper film are deposited on the semiconductor substrate 10. After that, an opening corresponding to the isolation region Rto is formed in the polysilicon film 22 and the photoresist film FR1 is formed to cover the element formation regions Rtr. Subsequently, etching is performed using the above photoresist film FR1 as a mask so as to selectively remove the polysilicon film 22, the gate insulating film 21, and the semiconductor substrate 10, thereby forming the trench 10a having a specified depth of about 500 nm. In this process, the etching conditions are determined so that the taper angle θ between the surface of the substrate 10 and the side face of the trench 10a becomes 90° or less (within the range of 80° to 100°).

Next, as shown in FIG. 4(b), the photoresist film FR1 is removed and a silicon dioxide film is deposited on the substrate to a thickness larger than the depth of the trench 10a so as to compose the insulating film 31 for isolation with a thickness of about 800 to 1000 nm, with which the trench 10a is filled. Unlike the insulating films for isolation used in the above first and second embodiments, the insulating film 31 for isolation used in the present embodiment has no reflowability.

In the present embodiment, since the trench 10a is outwardly tapered with its width gradually increasing toward the bottom thereof as shown in FIG. 4(b), the shadowing effect is enhanced and the upper part of the trench 10a is filled with the insulating film 31 for isolation at an early stage of deposition. Consequently, the void 19 which is substantially circular in cross section is formed deep inside the trench 10a.

Next, as shown in FIG. 4(c), the substrate surface is substantially planarized using, e.g., CMP. As a result, the insulating film 31 for isolation is completely removed from the element formation regions Rtr, thereby exposing the surface of the silicon nitride film 22. At this stage, the insulating film for isolation remaining in the trench 10a forms the isolation 31a.

Next, as shown in FIG. 4(d), the polysilicon film 23 as the second conductive film is deposited on the planarized substrate to a thickness of about 100 to 200 nm, on which is formed the photoresist film FR2 which covers the regions in which the gate electrodes and the like are to be formed.

Next, as shown in FIG. 4(e), the two polysilicon films 22 and 23 are etched using the photoresist film FR2 as a mask, thereby patterning the gate electrode 50 composed of the lower film 22a and the upper film 23a.

After that, the same process step as shown in FIG. 1(g) of the above first embodiment is performed as shown in FIG. 4(f), thereby finishing the semiconductor device.

Since the present embodiment has also used the trench 10a for isolation having the outwardly tapered profile, the void 19 is formed deep inside the isolation 10a, which surely prevents the void 19 from being opened in the substrate surface. Unlike the above third embodiment, the present embodiment does not comprise the step of etching away the silicon nitride film 12 and silicon dioxide film 11. Accordingly, the silicon dioxide film composing the isolation 31a, which is removed to a certain extent during the step of the above third embodiment, is not removed at all. Hence, the opening of the void 19 can be prevented more positively since the thickness of the isolation 31a is not reduced. Moreover, since the underlay in patterning the gate electrode 50 is flat with no difference in level, a micropattern can stably be formed.

Although the upper film of the gate electrode 50 is composed of the polysilicon film 23 in the above embodiment, it may be composed of a silicide such as Wsi or TiSi. The upper film may also be composed of a multilayer film consisting of a barrier metal such as TiN and a high-melting-point metal such as W for the purpose of reducing the electric resistance of the gate electrode.

(Fifth Embodiment)

A manufacturing method of the present embodiment is characterized in that sidewalls are formed in the trench prior to depositing the insulating film for isolation.

Initially, in the step shown in FIG. 5(a), the silicon dioxide film 11 with a thickness of about 10 to 20 nm and the silicon nitride film 12 with a thickness of about 100 to 200 nm as the etching stopper film are deposited on the semiconductor substrate 10. Then, an opening corresponding to the isolation region Rto is formed in the silicon nitride film 12 and a photoresist film is formed to cover the element formation regions Rtr. Subsequently, etching is performed using the above photoresist film as a mask so as to selectively remove the silicon nitride film 12, the silicon dioxide film 11, and the semiconductor substrate 10, thereby forming the trench 10a having a specified depth of about 500 nm. In this process, the taper angle θ between the surface of the substrate 10 and the side face of the trench 10a is preferably about 90° (within the range of 80° to 100°). With the trench 10a having been formed, a HTO film 32 is formed on the substrate to a thickness equal to or less than ½ of the minimum width of the trench 10a. For example, if the minimum width of the trench 10a is assumed to be 500 nm, the thickness of the HTO film is preferably about 150 to 200 nm. However, these dimensions are not limited to the above values.

Next, as shown in FIG. 5(b), the HTO film 32 is etched back, thereby removing the HTO film 32 from the element formation regions Rtr, while leaving sidewalls 32a on the side faces of the trench 10a.

Next, as shown in FIG. 5(c), a silicon dioxide film is deposited on the substrate to a thickness larger than the depth of the trench 10a so as to compose the insulating film 31 for isolation with a thickness of about 800 to 1000 nm, with which the trench 10a is filled. The insulating film 31 for isolation used in the present embodiment has no reflowability. Since the sidewalls 32a have been formed on the side faces of the trench 10a, the same effect as achieved by the trench 10a having a large taper angle θ can be achieved. Consequently, the shadowing effect is lessened and hence no void is formed in the trench 10a.

Next, as shown in FIG. 5(d), the inverted pattern of the element formation regions Rtr is formed from a photoresist film, which is used in subsequent etch back, thereby substantially planarizing the substrate surface. As a result, the insulating film 31 for isolation is completely removed from the element formation regions Rtr, thereby exposing the surface of the silicon nitride film 12. At this stage, the isolation 31a composed of the insulating film for isolation remaining in the trench 10a is formed in the isolation region Rto. Since it is necessary to perform overetching in order to completely expose the silicon nitride film 12, the isolation 31a is etched till its top surface is positioned slightly lower than the top surface of the silicon nitride film 12.

Next, as shown in FIG. 5(e), the silicon nitride film 12 is removed using, e.g., hot phosphoric acid and the silicon dioxide film 11 is subsequently removed using, e.g., a wet etching agent containing hydrofluoric acid as the main component, thereby completing the process of forming the isolation. In this process, since the silicon dioxide film composing the isolation also undergoes the etching effect, the top surface of the isolation 31a is further lowered in position, so that the surface of the isolation 31a becomes substantially flush with the surface of the semiconductor substrate 10 in the element formation regions Rtr and the whole substrate has been flattened. Conversely, the present embodiment determines respective thicknesses of the silicon dioxide film 11 and silicon nitride film 12 and the amount of overetching so as to flatten the whole substrate in this process step.

Next, as shown in FIG. 5(f), the gate insulating film 16 and polysilicon film are deposited on the substrate and the polysilicon film is patterned into the gate electrodes 17a.

After that, the same process step as shown in FIG. 1(g) of the first embodiment is performed, though the drawing thereof is omitted, thereby finishing the semiconductor device.

In the present embodiment, since the sidewalls 32a have been formed in the trench 10a in depositing the insulating film for isolation in the trench 10a in the step shown in FIG. 5(c), the same effect as achieved by the inwardly tapered trench 10a having a large taper angle θ can be achieved. Consequently, the shadowing effect is lessened and hence no void is formed in the insulating film 31 for isolation. Moreover, since the trench 10a is so configured as to be untapered or tapered only slightly such that the taper angle θ between the side face thereof and the substrate surface becomes approximately 90°, the width in the bottom portion of the trench 10a is substantially the same as the width in the upper portion of the trench 10a. As a result, the formation of the void is effectively prevented, while ensuring excellent isolating function.

Instead of the HTO film 32, such a conductive film as a silicon nitride film or a polysilicon film may be used.

(Sixth Embodiment)

The present embodiment is different from the above fifth embodiment in that, prior to depositing the insulating film for isolation, a recessed portion with steeply sloped side faces is formed in the vicinity of the bottom of the trench between the sidewalls on the side faces thereof, so that the recessed portion is positioned deep inside the trench by depositing the insulating film for isolation thereon.

Initially, in the step shown in FIG. 6(a), the silicon dioxide film 11 with a thickness of about 10 to 20 nm and the polysilicon film 22 with a thickness of about 100 to 300 nm as the etching stopper film are deposited on the semiconductor substrate 10. After that, an opening corresponding to the isolation region Rto is formed in the polysilicon film 22 and a photoresist film is formed to cover the element formation regions Rto. Subsequently, etching is performed using the above photoresist film as a mask so as to selectively remove the polysilicon film 22, the silicon dioxide film 11, and the semiconductor substrate 10, thereby forming the trench 10a having a specified depth of about 500 nm. In this process, the taper angle θ between the surface of the substrate 10 and the side face of the trench 10a is preferably about 90° (within the range of 80° to 100°). With the trench 10a having been formed, the HTO film 32 is formed on the substrate to a thickness equal to or less than ½ of the minimum width of the trench 10a. In this case, however, it is preferable that the HTO film 32 has a relatively large thickness provided that the above requirement is satisfied. For example, if the minimum width of the trench 10a is assumed to be 500 nm, the thickness of the HTO film is preferably about 200 to 250 nm. However, these dimensions are not limited to the above values.

Next, as shown in FIG. 6(b), the HTO film 32 is etched back to such a depth that the sidewalls 32b deposited on the side faces of the trench 10a interfere with each other on the bottom face or that the recessed portion with steeply sloped side faces is formed between the sidewalls 32b, which have been separated from each other. As a result of etching, the upper edges of the sidewalls 32 are positioned lower than the upper edge of the trench 10a. Such sidewalls are implemented by overetching.

Next, as shown in FIG. 6(c), a silicon dioxide film is deposited on the substrate to a thickness larger than the depth of the trench 10a so as to compose the insulating film 31 for isolation with a thickness of about 800 to 1000 nm, with which the trench 10a is filled. The insulating film 31 for isolation used in the present embodiment has no reflowability. At this step, since the recessed portion with steeply sloped side faces has been formed between the sidewalls 32b deposited on the side faces of the trench 10a, the aspect ratio in the recessed portion with steeply sloped side faces becomes locally higher than in other portions, so that a void 20 is formed deep inside the insulating film 31 for isolation.

Next, as shown in FIG. 6(d), the inverted pattern of the element formation regions Rtr is formed from a photoresist film, which is used in subsequent etch back to substantially planarize the substrate surface. As a result, the insulating film 31 for isolation is completely removed from the element formation regions Rtr, so as to expose the surface of the polysilicon film 22. At this stage, the insulating film for isolation remaining in the trench 10a forms the isolation 31a in the isolation region Rto. Since it is necessary to perform slight overetching in order to completely expose the polysilicon film 22, the isolation 31a is etched till its top surface is positioned slightly lower than the top surface of the polysilicon film 22. However, since the void 20 has been formed deep inside the isolation 31a, it is not opened in the surface of the isolation 31a during the step.

Next, as shown in FIG. 6(e), the polysilicon film 22 is removed using a dry etching agent or a mixture etchant of oxidizing agent, hydrofluoric acid, and the like and the silicon dioxide film 11 is subsequently removed using a wet etching agent containing hydrofluoric acid as the main component, thereby completing the process of forming the isolation. In this process, since the silicon dioxide film composing the isolation also undergoes the etching effect, the top surface of the isolation 31a is further lowered in position, so that the surface of the isolation 31a becomes substantially flush with the surface of the semiconductor substrate 10 in the element formation regions Rtr. In this step also, the void 20 is not opened in the surface of the isolation 31a.

Next, as shown in FIG. 6(f), the gate insulating film 16 and polysilicon film are deposited on the substrate and the polysilicon film is patterned into the gate electrodes 17a.

After that, the same process step as shown in FIG. 1(g) of the first embodiment is performed, though the drawing thereof is omitted, thereby finishing the semiconductor device.

In the present embodiment, the recessed portion with steeply sloped side faces has been formed between the sidewalls 32b deposited on the side faces of the trench 10a in the step of depositing the insulating film for isolation in the trench 10a, which is shown in FIG. 6(c). Moreover, overetching has been performed till the upper edges of the sidewalls 32b are positioned lower than the upper edge of the trench 10a. Consequently, the void 20 is formed deep inside the insulating film 31 for isolation deposited thereon and it is not opened in the surface of the isolation 31a during the subsequent step. Furthermore, since the trench 10a can be so configured as to be untapered or tapered only slightly such that the taper angle θ between the side face and the substrate surface becomes approximately 90°, the width in the bottom portion of the trench 10a is substantially the same as the width in the upper portion of the trench 10a. Therefore, even in a highly integrated semiconductor device, degradation of reliability can be prevented, while ensuring excellent isolating function.

Instead of the HTO film 32, such a conductive film as a silicon nitride film or a polysilicon film may be used.

(Seventh Embodiment)

The present embodiment is different from the above sixth embodiment in that, in depositing the insulating film for isolation, the void is formed in a deep portion thereof by using the slit-like void (elliptical in cross section) formed in depositing the film for filling.

Initially, in the step shown in FIG. 7(a), the silicon dioxide film 11 with a thickness of about 10 to 20 nm and the polysilicon film 22 with a thickness of about 100 to 300 nm as the etching stopper film are deposited on the semiconductor substrate 10. After that, an opening corresponding to the isolation region Rto is formed in the polysilicon film 22 and a photoresist film is formed to cover the element formation regions Rto. Subsequently, etching is performed using the above photoresist film as a mask so as to selectively remove the polysilicon film 22, the silicon dioxide film 11, and the semiconductor substrate 10, thereby forming a trench 10a having a specified depth of about 500 nm. In this process, the taper angle θ between the surface of the substrate 10 and the side face of the trench 10a is preferably about 90° (within the range of 80° to 100°). With the trench 10a having been formed, a silicon dioxide film is formed on the substrate to a thickness equal to or more than ½ of the minimum width of the trench 10a so as to compose the HTO film 32. For example, if the minimum width of the trench 10a is assumed to be 500 nm, the thickness of the HTO film is preferably 250 to 500 nm. During the process, the slit-like void (elliptical in cross section) 19 is formed in the HTO film 32 in the isolation region Rto with a reduced width.

Figure 7B:
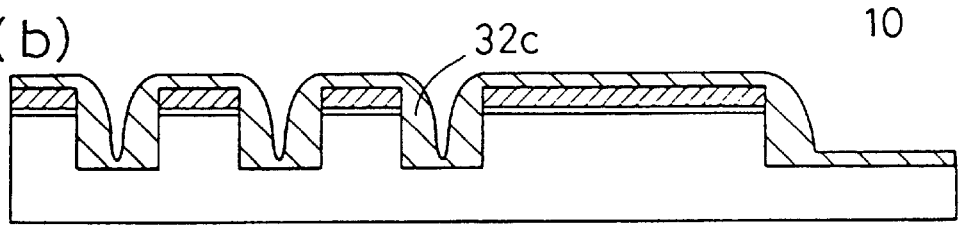

Next, as shown in FIG. 7(b), the HTO film 32 is etched back till the void 19 is sufficiently opened. In this step, a remaining portion 32c of the HTO film may extend over the polysilicon film 22, depending on the thickness of the HTO film 32 or on the amount of etching. However, since a silicon dioxide film is redeposited thereon, there should be no problem.

Figure 7C:
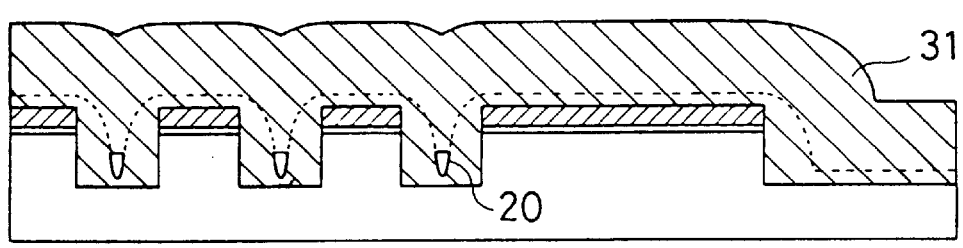

Next, as shown in FIG. 7(c), a silicon dioxide film is deposited on the substrate to a thickness larger than the depth of the trench 10a so as to compose the insulating film 31 for isolation with a thickness of about 800 to 1000 nm, with which the trench 10a is filled. The insulating film 31 for isolation used in the present embodiment has no reflowability. At this stage, since the void 19 having a slit-like cross section in the trench 10a has been opened, the recessed portion with steeply sloped side faces has been formed. With the insulating film 31 for isolation deposited thereon, the void 20 is formed deep inside the trench 10a, similarly to the above sixth embodiment.

Figure 7D:
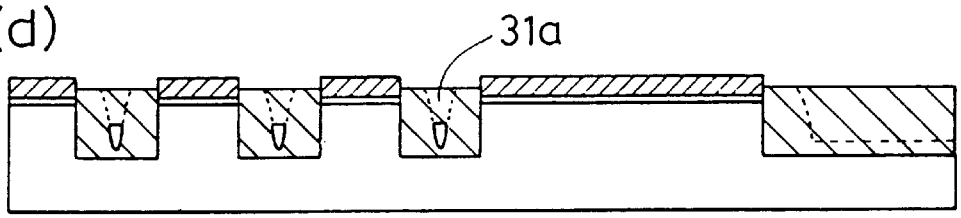
Figure 7E:
Figure 7F:
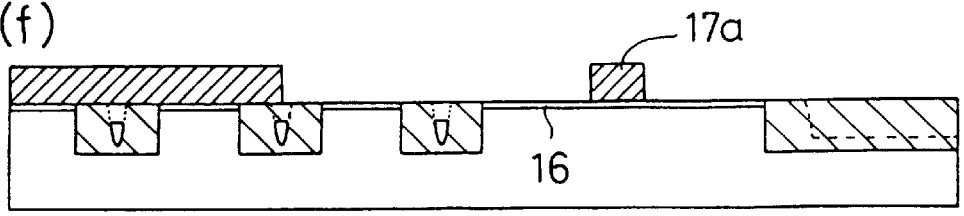

After that, the same process steps as shown in FIGS. 6(d) to 6(f) are performed in respective process steps shown in FIGS. 7(d) to 7(f). Thereafter, the same process step as shown in FIG. 1(g) of the first embodiment is performed, thereby finishing the semiconductor device.

In the present embodiment, since the recessed portion with the steeply sloped side faces has been formed by opening the void 19 deep inside the trench 10a in the step of depositing the insulating film for isolation, which is shown in FIG. 7(c), the void 20 is formed in the insulating film 31 for isolation deposited thereon by the same action as obtained in the above sixth embodiment. However, since the portion in which the void 20 is formed is located deep inside the insulating film 31 for isolation, the void 20 is not opened in the surface of the isolation 31a during the subsequent step. Furthermore, since the trench 10a can be so configured as to be untapered or tapered only slightly such that the taper angle θ between the side face and the substrate surface becomes approximately 90°, the width in the bottom portion of the trench 10a is substantially the same as the width in the upper portion of the trench 10a. Therefore, even in a highly integrated semiconductor device, degradation of reliability can be prevented, while ensuring excellent isolating function.

(Eighth Embodiment)

The present embodiment is different from the above fifth to seventh embodiments in that, prior to depositing the insulating film for isolation, a film with excellent step coverage is deposited to be filled in the trench.

Initially, in the step shown in FIG. 8(a), the silicon dioxide film 11 with a thickness of about 10 to 20 nm and the polysilicon film 22 with a thickness of about 100 to 300 nm as the etching stopper film are deposited on the semiconductor substrate 10. After that, an opening corresponding to the isolation region Rto is formed in the polysilicon film 22 and a photoresist film is formed to cover the element formation regions Rto. Subsequently, etching is performed using the above photoresist film as a mask so as to selectively remove the polysilicon film 22, the silicon dioxide film 11, and the semiconductor substrate 10, thereby forming a trench 10a having a specified depth of about 500 nm. In this process, the taper angle θ between the surface of the substrate 10 and the side face of the trench 10a is preferably about 90° (within the range of 80° to 100°). With the trench 10a having been formed, an underlying insulating film 40 composed of a HTO film is deposited on the substrate, on which is further deposited a polysilicon film with excellent step coverage to a thickness larger than ½ of the depth of the trench 10a so as to compose the film 33 for filling. For example, if the minimum width of the trench 10a is assumed to be 500 nm, the thickness of the polysilicon film is preferably 250 to 300 nm. In this case, since the polysilicon film has excellent step coverage, no void is formed in the film 33 for filling.

Next, as shown in FIG. 8(b), the film 33 for filling is etched back, thereby leaving a buried layer 33a in the vicinity of the bottom portion of the trench 10a, while completely removing the film 33 for filling from the element formation regions Rtr.

Next, as shown in FIG. 8(c), a silicon dioxide film is deposited on the substrate to a thickness larger than the depth of the trench 10a so as to compose the insulating film 31 for isolation, with which the trench 10a is filled. The insulating film 31 for isolation used in the present embodiment has no reflowability. At this stage, since the buried layer 33a remains on the bottom portion of the trench 10a, the same effect as achieved by the trench 10a having a reduced aspect ratio is achieved with no void formed in the insulating film 31 for isolation.

Next, as shown in FIG. 8(d), the inverted pattern of the element formation regions Rtr is formed from a photoresist film, which is used in subsequent etch back to substantially planarize the substrate surface. As a result, the insulating film 31 for isolation and underlying insulating film 40 are completely removed from the element formation regions Rtr, so as to expose the surface of the polysilicon film 22. At this stage, the insulating film 31a for isolation, buried layer 33a, and underlying film 40a remaining in the trench 10a form an isolation 51 in the isolation region Rto. Since it is necessary to perform overetching in order to completely expose the polysilicon film 22, the isolation 51 is etched till its top surface is positioned slightly lower than the top surface of the polysilicon film 22.

After that, the same process steps as shown in FIGS. 6(e) and 6(f) are performed in the process steps shown in FIGS. 8(e) and 8(f). Thereafter, the same process step as shown in FIG. 1(g) of the first embodiment is performed, thereby finishing the semiconductor device.

In the present embodiment, since the buried layer 33a has been formed in the trench 10a in the step of depositing the insulating film 31 for isolation in the trench 10a, which is shown in FIG. 8(c), the same effect as achieved by the trench 10a having a reduced aspect ratio can be achieved. Consequently, no void is caused by the shadowing effect. Furthermore, since the trench 10a can be so configured as to be untapered or tapered only slightly such that the angle between the side face and the substrate surface becomes approximately 90°, the width in the bottom portion of the trench 10a is substantially the same as the width in the upper portion of the trench 10a. Therefore, even in a highly integrated semiconductor device, degradation of reliability can be prevented, while ensuring excellent isolating function.

Although the film 33 for filling has been composed of the polysilicon film in the present embodiment, it may be composed of a film of any material provided that excellent step coverage is achieved, such as a silicon nitride film. The film 33 for filling may also be composed of a conductive film or a ferroelectric film.

(Ninth Embodiment)

The present embodiment is different from the above eighth embodiment in that, prior to depositing the insulating film for isolation, a reflowable film which has been deposited and caused to reflow so as to eliminate the void formed therein is preliminarily buried in the trench.

Figure 9A:
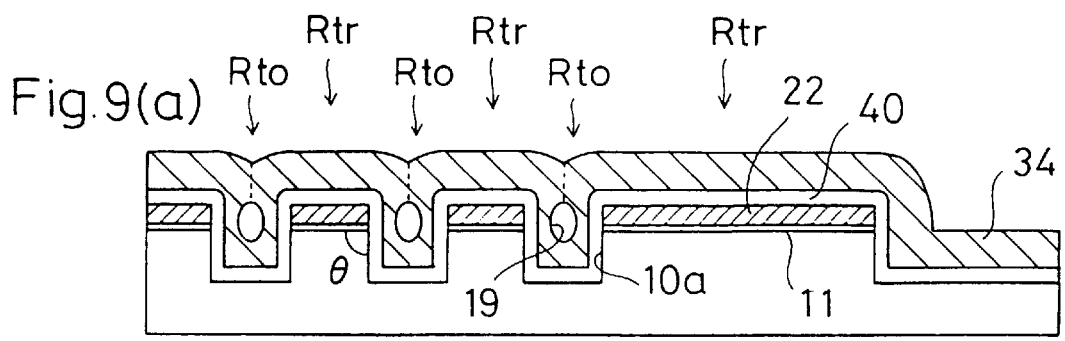
FIGS. 9(a) to 9(f) are cross sectional views illustrating a method of manufacturing a semiconductor device according to a ninth embodiment.

Initially, in the step shown in FIG. 9(a), the silicon dioxide film 11 with a thickness of about 10 to 20 nm and the polysilicon film 22 with a thickness of about 100 to 300 nm as the etching stopper film are deposited on the semiconductor substrate 10. After that, an opening corresponding to the isolation region Rto is formed in the polysilicon film 22 and a photoresist film is formed to cover the element formation regions Rto. Subsequently, etching is performed using the above photoresist film as a mask so as to selectively remove the polysilicon film 22, the silicon dioxide film 11, and the semiconductor substrate 10, thereby forming the trench 10a having a specified depth of about 500 nm. In this process, the taper angle $\theta$ between the surface of the substrate 10 and the side face of the trench 10a is preferably about 90° (within the range of 80° to 100°). With the trench 10a having been formed, an underlying insulating film 40 composed of a HTO film is formed on the substrate, on which is further deposited a BPSG film to a thickness larger than ½ of the depth of the trench 10a, so as to compose a film 34 for filling with a thickness of 300 to 500 nm. The film 34 for filling is composed of a reflowable film such as a silane-based BPSG film or a TEOS-based BPSG film. Instead of the BPSG films, such films as a PSG film, a BSG film, or a silicon dioxide film containing arsenic can also be used. It is also possible to deposit a silicon dioxide film and then impart reflowability thereto by implanting impurity ions into the silicon dioxide film.

Since the aspect ratio of the trench 10a is high in the isolation region Rto with a reduced width, similarly to the case shown in FIG. 1(b), the probability of the void 19 being formed in the insulating film 34 for filling is extremely high.

Figure 9B:
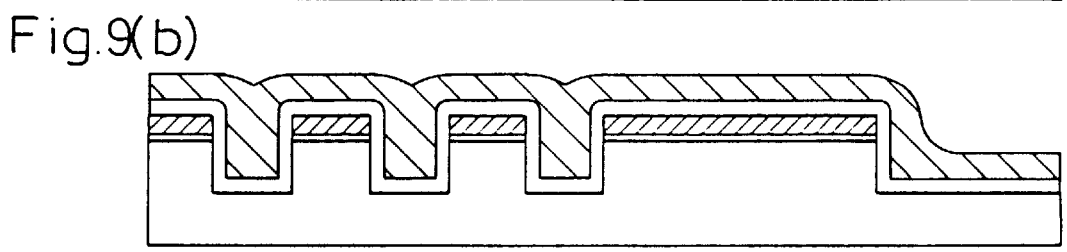

Next, as shown in FIG. 9(b), the film 34 for filling is caused to reflow by a thermal treatment, e.g., at 850° C. for about 30 minutes, thereby eliminating the void 19.

Figure 9C:
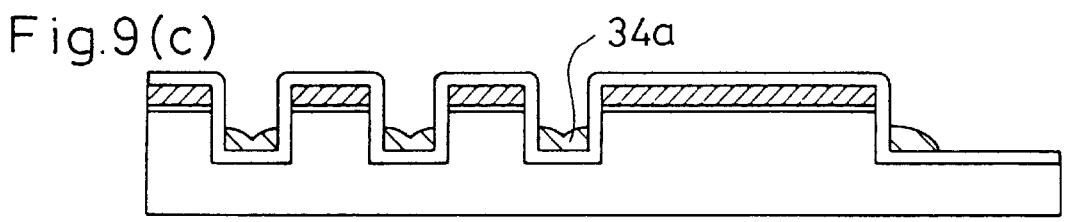

Next, as shown in FIG. 9(c), the film 34 for filling is etched back, thereby completely removing the film 34 for filling from the element formation regions Rtr, while leaving a buried layer 34a in the vicinity of the bottom portion of the trench 10a.

Figure 9D:
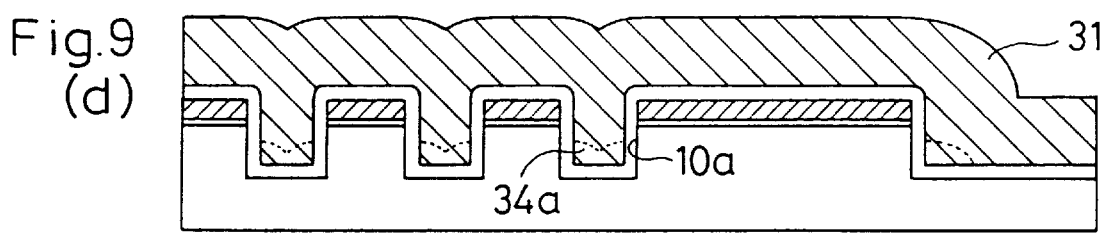

Next, as shown in FIG. 9(d), a silicon dioxide film is deposited on the substrate to a thickness larger than the depth of the trench 10a so as to compose the insulating film 31 for isolation with a thickness of about 800 to 1000 nm, with which the trench 10a is filled. The insulating film 31 for isolation may be composed of a film having or not having reflowability. At this stage, since the buried layer 34a has been formed on the bottom portion of the trench 10a, the same effect as achieved by the trench 10a having a reduced aspect ratio is achieved with no void formed in the insulating film 31 for isolation.

Figure 9E:
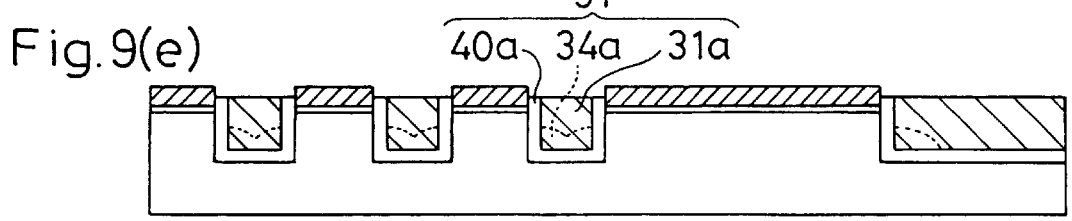
Figure 9F:
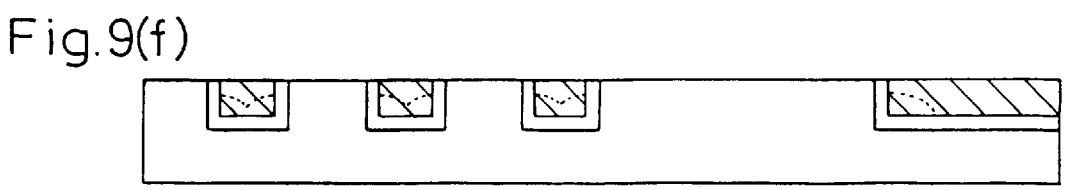
Figure 13A:
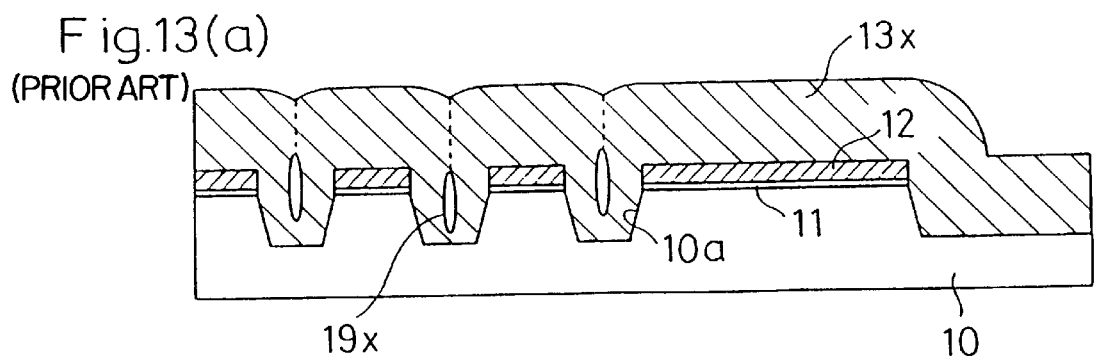
FIGS. 13(a) and 13(b) are partially enlarged cross sectional views of the step illustrated in FIG. 12.
Figure 13B:
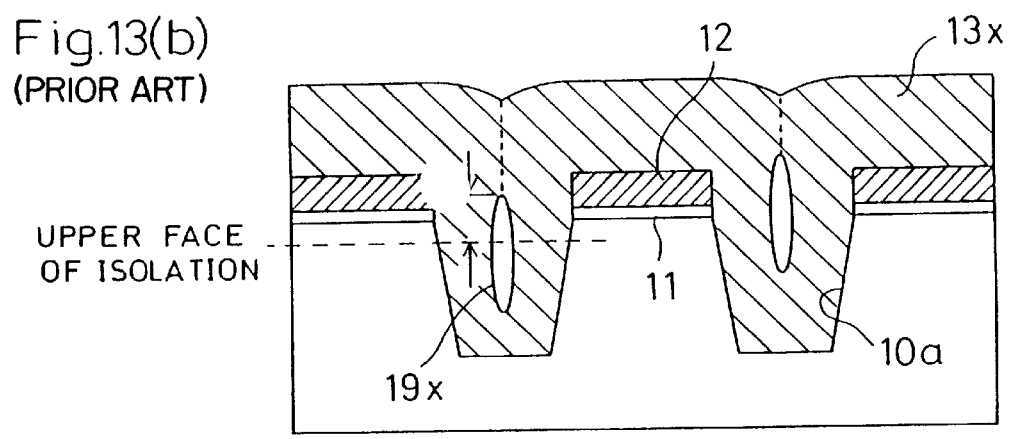
Figure 14:
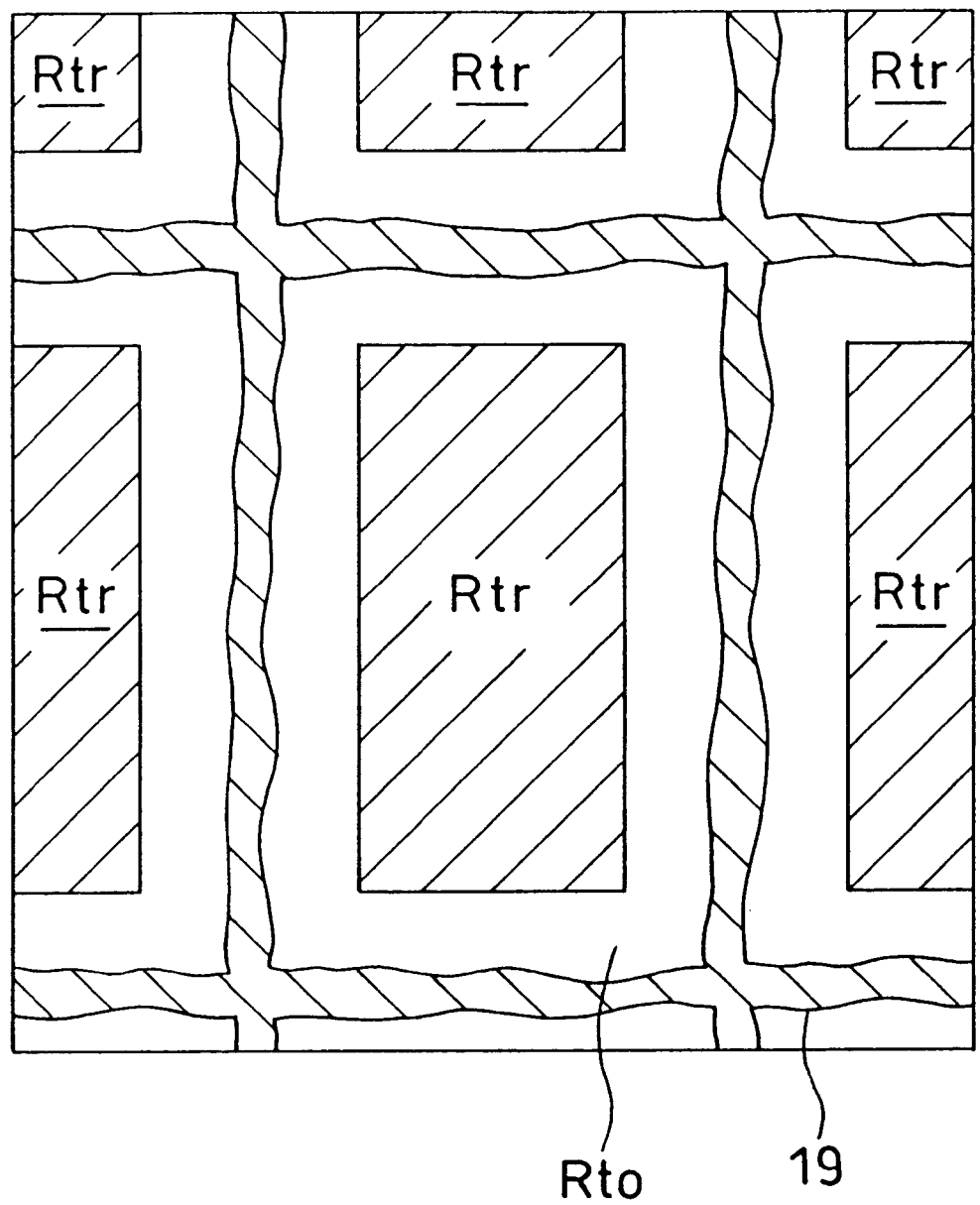
FIG. 14 is a plan view of the conventional semiconductor device at the stage at which the step of forming isolation has been complete.

After that, the same process steps as shown in FIGS. 6(e) and 6(f) are performed in the process steps shown in FIGS. 9(e) and 9(f). Thereafter, the same process step as shown in FIG. 1(g) of the first embodiment is performed, thereby finishing the semiconductor device.

In the present embodiment, since the buried layer 34a has been formed in the trench 10a in the step of depositing the insulating film 31 for isolation in the trench 10a, which is shown in FIG. 9(d), the same effect as achieved by the trench 10a having a reduced aspect ratio can be achieved. Consequently, no void is caused by the shadowing effect. Furthermore, since the trench 10a can be so configured as to be untapered or tapered only slightly such that the taper angle $\theta$ between the side face and the substrate surface becomes approximately 90°, the width in the bottom portion of the trench 10a is substantially the same as the width in the upper portion of the trench 10a. Therefore, even in a highly integrated semiconductor device, degradation of reliability can be prevented, while ensuring excellent isolating function.

Although the film 34 for filling has been composed of the BPSG film in the present embodiment, it may be composed of any film made of a reflowable material. It will be appreciated that the film 34 for filling may also be composed of a PSG film or a BSG film.

The provision of the underlying insulating film 40 may be omitted depending on cases. However, the provision of the underlying insulating film 40 has the advantage of preventing the impurity from intruding into the semiconductor substrate.

(Tenth Embodiment)

The present embodiment is characterized in that, after the isolation is formed from polysilicon or like material with excellent step coverage, at least a part of he isolation is oxidized into an insulating film.

Initially, in the step shown in FIG. 10(a), the silicon dioxide film 11 with a thickness of about 10 to 20 nm and the silicon nitride film 12 with a thickness of about 100 to 200 nm as the etching stopper film are deposited on the semiconductor substrate 10. Then, an opening corresponding to the isolation region Rto is formed in the silicon nitride film 12 and a photoresist film is formed to cover the element formation regions Rto. Subsequently, etching is performed using the above photoresist film as a mask so as to selectively remove the silicon nitride film 12, the silicon dioxide film 11, and the semiconductor substrate 10, thereby forming the trench 10a having a specified depth of about 500 nm. In this process, the taper angle θ between the surface of the substrate 10 and the side face of the trench 10a is preferably about 90° (within the range of 80° to 100°). With the trench 10a having been formed, the underlying insulating film 40 composed of a HTO film is formed on the substrate, on which is further deposited a polysilicon film 35 with excellent step coverage to a thickness of about 800 to 1000 nm, which is larger than the depth of the trench 10a. In this case, since the polysilicon film 35 has excellent step coverage, no void is formed in the polysilicon film 35 in the trench 10a.

Next, as shown in FIG. 10(b), the polysilicon film 35 is removed by CMP, thereby planarizing the whole substrate. In this process, CMP is performed till the surface of the silicon nitride film 12 in the element formation regions Rtr becomes exposed, thereby removing the polysilicon film 35 and underlying insulating film 40 from the element formation regions Rtr, while leaving the underlying film 40a and a buried film 35a in the isolation region Rto.

Next, as shown in FIG. 10(c), the buried film 35a is oxidized from its surface such that a part thereof extending from the surface to a specified depth is changed into a silicon dioxide film. As a result, an upper buried layer 35b composed of the silicon dioxide film, the lower buried layer 35a composed of the polysilicon film, and the underlying insulating film 40a form the isolation 51. In this case, the oxidation of the buried film 35a composed of the polysilicon film causes an increase in volume, so that the top surface of the isolation 51 is raised in level.

Next, as shown in FIG. 10(d), the silicon nitride film 12 is removed using, e.g., hot phosphoric acid and the silicon dioxide film 11 is subsequently removed using, e.g., a wet etching agent containing hydrofluoric acid as the main component, thereby completing the process of forming the isolation.

Then, as shown in FIG. 10(e), the gate insulating film 16 and polysilicon film are deposited on the substrate so that the polysilicon film is patterned into the gate electrodes 17a.

Thereafter, the same process step as shown in FIG. 1(g) of the first embodiment is performed, though the description thereof is omitted, thereby finishing the semiconductor device.

In the present embodiment, no void is formed in the trench 10a in the step of depositing the polysilicon film with excellent step coverage in the trench 10a, which is shown in FIG. 10(a). Furthermore, since the trench 10a can be so configured as to be untapered or tapered only slightly such that the taper angle θ between the side face and the substrate surface becomes approximately 90°, the width in the bottom portion of the trench 10a is substantially the same as the width in the upper portion of the trench 10a. Therefore, even in a highly integrated semiconductor device, degradation of reliability can be prevented, while ensuring excellent isolating function.

Instead of the polysilicon film 35, an amorphous silicon film may be deposited and oxidized afterward. It is also possible to oxidize the whole polysilicon film or the whole amorphous silicon film.

(Other Embodiments)

Although each of the above first to fourth embodiments has performed the planarizing process by CMP, it is also possible to substantially planarize the whole substrate by forming the inverted pattern of the element formation regions Rtr from the photoresist film and etch back the whole substrate, as performed in each of the above fifth to ninth embodiments.

Although each of the above fifth to ninth embodiments has performed planarization by etch back using the photoresist film after depositing the insulating film for isolation, it is also possible to perform planarization by CMP, as performed in each of the first to fourth embodiments. In this case, since the isolation undergoes only a negligible film reduction as described in the first to fourth embodiments, reliability and patterning accuracy are advantageously improved.

In the above fifth to ninth embodiments, at the stages shown in FIGS. 5(a), 6(a), 7(a), 8(a), and 9(a), it is possible to deposit a silicon nitride film, instead of the polysilicon film 22, and subsequently perform the same steps as performed in the fifth to ninth embodiments.

In the above fifth to ninth embodiments, at the stages shown in FIGS. 5(a), 6(a), 7(a), 8(a), and 9(a), the polysilicon film 22 may not be removed so as to serve as the underlying film of the gate electrode as in the second and fourth embodiments. In this case, since the isolation raised in level forms a step between the surface of the semiconductor substrate in the element formation regions and the surface thereof, the isolation undergoes substantially no film reduction as described in the second to fourth embodiments. As a result, reliability and patterning accuracy are advantageously improved.

We claim:

1. A method of manufacturing a semiconductor device comprising:

a first step of depositing an etching stopper film on a semiconductor substrate having a plurality of element formation regions in which respective MOS transistors are to be formed and a trench isolation region for separating said individual element formation regions;

a second step of performing etching using a mask with an opening corresponding to said isolation region so as to partially remove said etching stopper film and said semiconductor substrate from said isolation region and thereby form a trench having a specified depth in said semiconductor substrate;

a third step of depositing, on the substrate formed with said trench, an insulating film for filling;

a fourth step of etching back said insulating film for filling so as to form a buried layer in a position at least lower than an upper edge of said trench;

a fifth step of depositing, with said buried layer formed in said trench, an insulating film for isolation on the substrate;

a sixth step of substantially planarizing a surface of the substrate by removing said insulating film for isolation till at least a surface of said etching stopper film becomes exposed, while leaving said insulating film for isolation in said trench, so as to form isolation; and a seventh step of forming MOS transistors each having a gate insulating film, a gate electrode, and source/drain regions in said respective element formation regions.

2. A method of manufacturing a semiconductor device according to claim 1, wherein in said third step, the insulating film for filling is deposited to such a thickness that, in said fifth step, sidewalls are formed as said buried layer on respective side faces of said trench and a recessed portion having steeply sloped side faces is formed between lower parts of the sidewalls.

3. A method of manufacturing a semiconductor device according to claim 1, wherein in said third step, the etching stopper film having a thickness equal to or more than ½ of a minimum width of said isolation region is deposited such that a void is formed in said insulating film for filling in a portion having a minimum width of said isolation region and in said fourth step, after said void is opened, said insulating film for filling is etched back till at least a part of the insulating film for filling beneath a lower edge of the void is removed.

4. A method of manufacturing a semiconductor device according to claim 1, wherein in said third step, an insulating film for filling which is made of a reflowable material and which has a thickness equal to or more than ½ of a minimum width of said isolation region is deposited as said insulating film for filling, said method further comprising the step of after said third step and prior to said fifth step, causing said film for filling to reflow by a thermal treatment.

5. A method of manufacturing a semiconductor device according to claim 4, further comprising the step of after said second step and prior to said third step, forming a diffusion preventing film on the substrate.

6. A method of manufacturing a semiconductor device according to claim 1, wherein said sixth step is performed by chemical mechanical polishing, said method further comprising the step of after said step and prior to said seventh step, removing said etching stopper film, wherein in said seventh step of forming said MOS transistors, a conductive film is newly deposited on the substrate and said conductive film is patterned into the gate electrodes of said MOS transistors.

7. A method of manufacturing a semiconductor device according to claim 1, wherein in said first step, a first conductive film is deposited as the etching stopper film via the gate insulating film and in said seventh step, a second conductive film is deposited on the substrate and said first and second conductive films are patterned into the gate electrodes of said MOS transistors.

8. A method of manufacturing a semiconductor device comprising:

a first step of depositing an etching stopper film on a semiconductor substrate having a plurality of element formation regions in which respective MOS transistors are to be formed and a trench isolation region for separating said individual element formation regions;

a second step of performing etching using a mask with an opening corresponding to said isolation region so as to partially remove said etching stopper film and said semiconductor substrate from said isolation region and thereby form a trench having a specified depth in said semiconductor substrate;

a third step of depositing, on the substrate formed with said trench, an underlying insulating film;

a fourth step of depositing, on the substrate with said underlying insulating film deposited thereon, a film for filling made of a material with excellent step coverage;

a fifth step of etching back said film for filling so as to form a buried layer in a position at least lower than an upper edge of said trench;

a sixth step of depositing, on the substrate with said buried layer formed therein, an insulating film for isolation;

a seventh step of substantially planarizing a surface of the substrate by removing said insulating film for isolation till at least a surface of said etching stopper film becomes exposed, while leaving said insulating film for isolation in said trench, so as to form isolation; and an eighth step of forming MOS transistors each having a gate insulating film, a gate electrode, and source/drain regions in said respective element formation regions.

9. A method of manufacturing a semiconductor device according to claim 8, wherein in said fourth step, either one of a polysilicon film and a silicon nitride film is deposited as said film for filling.

* * * * *